(12) United States Patent
Xu et al.

(10) Patent No.: US 11,335,114 B2
(45) Date of Patent: May 17, 2022

(54) ULTRASONIC PROTECTIVE FILM DETECTION AND ULTRASONIC SENSOR CALIBRATION

(71) Applicant: QUALCOMM Incorporated, San Diego, CA (US)

(72) Inventors: Changting Xu, Santa Clara, CA (US); Soon Joon Yoon, San Jose, CA (US); Camilo Perez Saaibi, San Francisco, CA (US); Hrishikesh Vijaykumar Panchawagh, Cupertino, CA (US); Kostadin Dimitrov Djordjev, Los Gatos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/947,883

(22) Filed: Aug. 21, 2020

(65) Prior Publication Data

US 2022/0058357 A1  Feb. 24, 2022

(51) Int. Cl.
| | |
|---|---|
| *G06V 40/13* | (2022.01) |
| *H01L 41/113* | (2006.01) |
| *G06F 3/0487* | (2013.01) |
| *G02B 1/14* | (2015.01) |

(52) U.S. Cl.
CPC ........ *G06V 40/1306* (2022.01); *G06F 3/0487* (2013.01); *H01L 41/1132* (2013.01); *G02B 1/14* (2015.01)

(58) Field of Classification Search
None
See application file for complete search history.

(56) References Cited

U.S. PATENT DOCUMENTS

| | | | |
|---|---|---|---|
| 2016/0247013 A1* | 8/2016 | Johansson | G06K 9/00087 |
| 2018/0276443 A1* | 9/2018 | Strohmann | G06K 9/0002 |
| 2020/0201459 A1 | 6/2020 | Withers et al. | |
| 2021/0165524 A1* | 6/2021 | Liu | G06K 9/00 |

FOREIGN PATENT DOCUMENTS

CN    110579271    12/2019

OTHER PUBLICATIONS

International Search Report and Written Opinion—PCT/US2021/040020—ISA/EPO—dated Oct. 25, 2021.

* cited by examiner

*Primary Examiner* — Nicholas J Lee
(74) *Attorney, Agent, or Firm* — Qualcomm Incorporated

(57) ABSTRACT

Some disclosed methods involve acquiring, via an ultrasonic sensor system, first (reference) ultrasonic signals at a first time and acquiring second ultrasonic signals via the ultrasonic sensor system at a second time. Such methods may involve determining, based at least in part on a comparison of the first ultrasonic signals and the second ultrasonic signals, whether one or more layers reside on the cover glass at the second time. If it is determined that the one or more layers reside on the cover glass at the second time, some methods may involve determining one or more signal characteristics corresponding to properties of the one or more layers and determining, based at least in part on the one or more properties, whether the one or more layers are compatible with the ultrasonic sensor system. If so, the method may involve calibrating the ultrasonic sensor system.

28 Claims, 17 Drawing Sheets

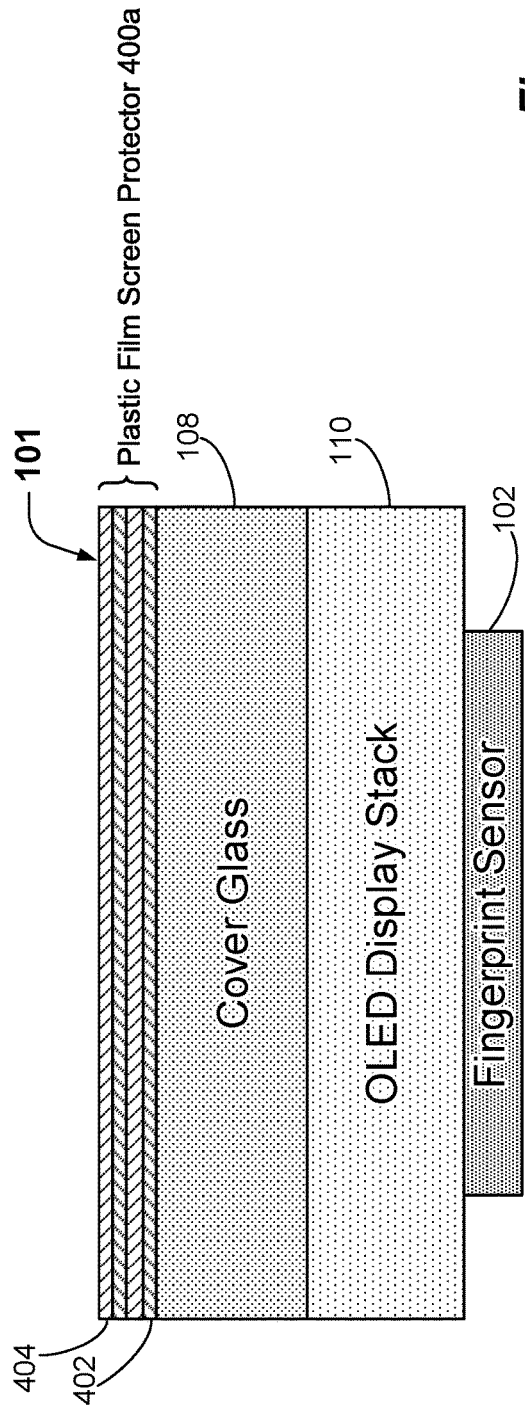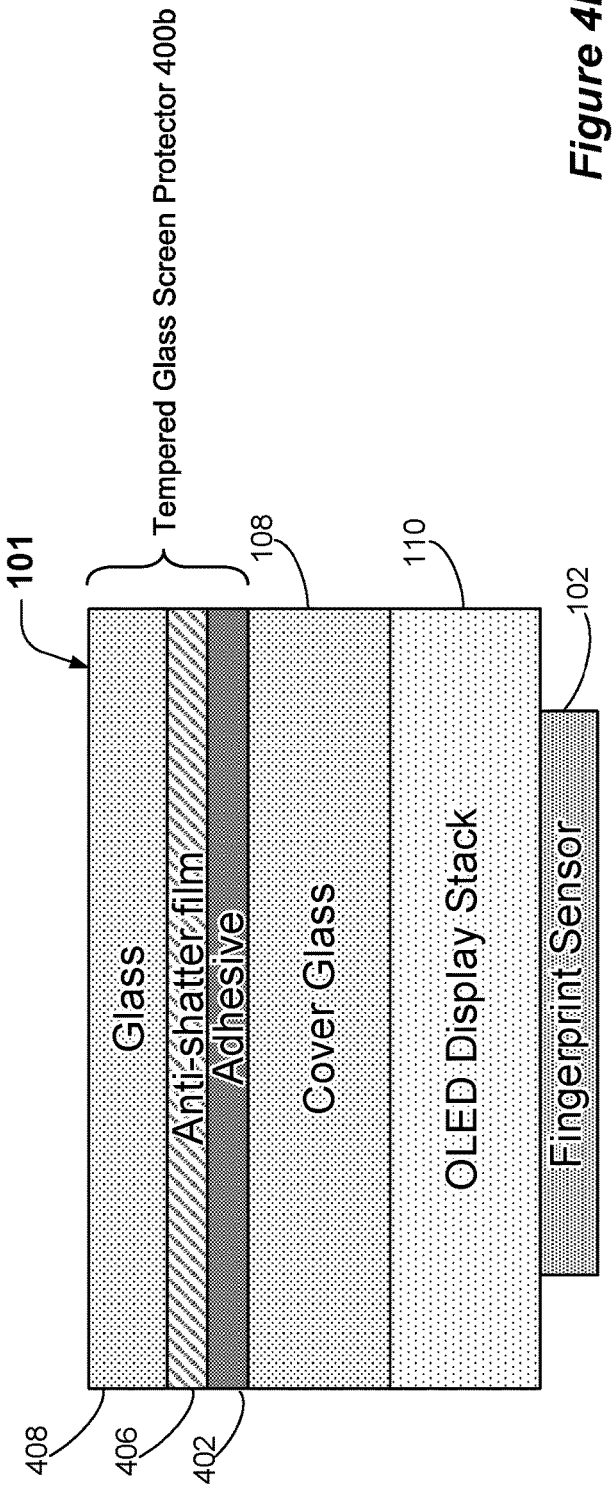

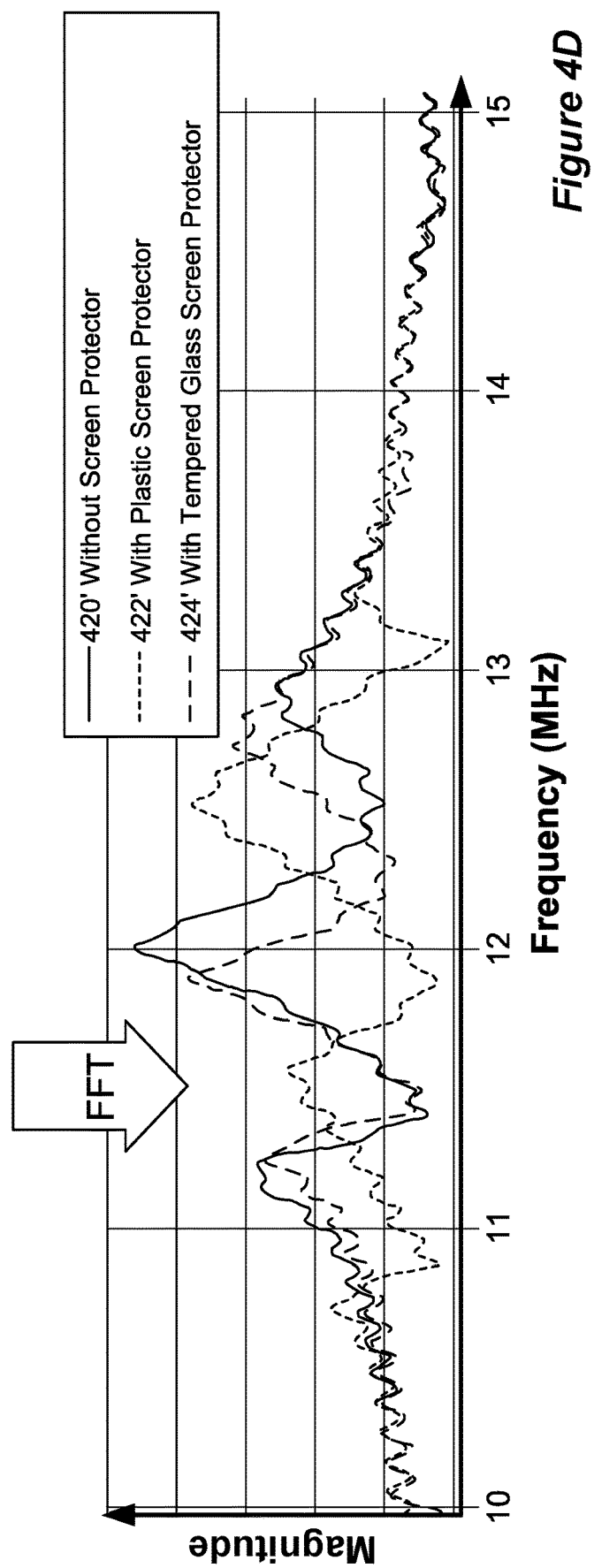

ULTRASONIC PROTECTIVE FILM DETECTION AND ULTRASONIC SENSOR CALIBRATION

TECHNICAL FIELD

This disclosure relates generally to sensor devices and related methods, including but not limited to ultrasonic sensor systems and methods for using such systems.

DESCRIPTION OF THE RELATED TECHNOLOGY

Biometric authentication can be an important feature for controlling access to devices, etc. Many existing products include some type of biometric authentication. Although some existing biometric authentication technologies provide satisfactory performance, improved methods and devices would be desirable.

SUMMARY

The systems, methods and devices of the disclosure each have several innovative aspects, no single one of which is solely responsible for the desirable attributes disclosed herein.

One innovative aspect of the subject matter described in this disclosure may be implemented in an apparatus. The apparatus may include an ultrasonic sensor system and a control system. In some instances, apparatus may include a cover glass. In some examples, at least part the control system is coupled (e.g. electrically or wirelessly coupled) to the ultrasonic sensor system.

The control system may include one or more general purpose single- or multi-chip processors, digital signal processors (DSPs), application specific integrated circuits (ASICs), field programmable gate arrays (FPGAs) or other programmable logic devices, discrete gates or transistor logic, discrete hardware components, or combinations thereof.

According to some examples, the control system may be configured to acquire first ultrasonic signals via the ultrasonic sensor system at what may be referred to herein as a "first time." In some instances, the "first time" may correspond to at least a portion of a factory calibration process. In some examples, the first ultrasonic signals may include reference ultrasonic signals corresponding to reflections from at least one of a cover glass/air interface or a cover glass/target interface.

In some examples, the control system may be configured to acquire second ultrasonic signals via the ultrasonic sensor system at what may be referred to herein as a "second time." In some instances, the "second time" may correspond to at least a portion of an end user calibration process.

According to some examples, the control system may be configured to determine, based at least in part on a comparison of the first ultrasonic signals and the second ultrasonic signals, whether one or more layers reside on the cover glass at the second time. In some such examples, if the control system determines that the one or more layers reside on the cover glass at the second time, the control system may be configured to determine one or more signal characteristics corresponding to one or more properties of the one or more layers and to determine, based at least in part on the one or more properties (and/or based on the signal characteristics), whether the one or more layers are compatible with the ultrasonic sensor system. The one or more properties may include thickness, material type and/or material patterning.

In some implementations, the ultrasonic sensor system may include a piezoelectric layer, an electrode (e.g., an electrode layer) proximate a first side of the piezoelectric layer and an array of ultrasonic sensor pixels proximate a second side of the piezoelectric layer. According to some such implementations, the first ultrasonic signals and the second ultrasonic signals may be received via the electrode.

In some instances, the control system may determine that the one or more layers are compatible with the ultrasonic sensor system. According to some such examples, the control system may be further configured to calibrate the ultrasonic sensor system based, at least in part, on the one or more properties of the one or more layers.

In some implementations, the apparatus also may include a display stack. In some such implementations, the display stack may reside between the ultrasonic sensor system and the cover glass. According to some such examples, the control system may be configured for controlling the display stack to present one or more graphical user interfaces corresponding to at least one of a factory calibration process or a fingerprint registration process. In some examples, the control system may be configured for controlling the display stack to present a graphical user interface prompting a user to ensure that there is no layer residing on the cover glass prior to acquiring the first ultrasonic signals.

In some implementations, the control system may determine that one or more layers are residing on the cover glass and may determine that the one or more layers are compatible with the ultrasonic sensor system. According to some such examples, the control system may be configured for controlling the display stack to present a graphical user interface which indicates an ultrasonic sensor system area and to prompt a user to ensure that there is no finger or other object in the ultrasonic sensor system area prior to acquiring the second ultrasonic signals.

In some examples, the control system determine that one or more layers are residing on the cover glass and may determine that the one or more layers are not compatible with the ultrasonic sensor system. According to some such examples, the control system may be further configured for controlling the display stack to present a graphical user interface prompting a user to remove the one or more layers.

In some implementations, the control system may be further configured for controlling the display stack to present a graphical user interface which indicates an ultrasonic sensor system area and prompts a user to touch the ultrasonic sensor system area. According to some such examples, the control system may be further configured for controlling the ultrasonic sensor system to acquire third ultrasonic signals at a third time. The third ultrasonic signals may, for example, include registration ultrasonic signals corresponding to reflections from a digit in contact with the ultrasonic sensor system area.

Other innovative aspects of the subject matter described in this disclosure may be implemented in a method of controlling an ultrasonic sensor system. In some examples, the method may involve acquiring first ultrasonic signals via the ultrasonic sensor system at a first time. The first time may, for example, correspond to at least a portion of a factory calibration process. The first ultrasonic signals may, for example, include reference ultrasonic signals corresponding to reflections from at least one of a cover glass/air interface or a cover glass/target interface.

According to some examples, the method may involve acquiring second ultrasonic signals via the ultrasonic sensor system at a second time. The second time may, for example, correspond to at least a portion of an end user calibration process.

In some examples, the method may involve determining, based at least in part on a comparison of the first ultrasonic signals and the second ultrasonic signals, whether one or more layers reside on a cover glass at the second time. According to some such examples, if it is determined that the one or more layers reside on the cover glass at the second time, the method may involve determining one or more signal characteristics corresponding to one or more properties of the one or more layers and determining, based at least in part on the one or more properties (and/or on the one or more signal characteristics), whether the one or more layers are compatible with the ultrasonic sensor system. The one or more properties may, for example, include thickness, material type and/or material patterning.

According to some implementations, the ultrasonic sensor system may include a piezoelectric layer, an electrode proximate a first side of the piezoelectric layer and an array of ultrasonic sensor pixels proximate a second side of the piezoelectric layer. In some such examples, the first ultrasonic signals and the second ultrasonic signals may be received via the electrode.

In some examples wherein it is determined that the one or more layers are compatible with the ultrasonic sensor system, the method also may involve calibrating the ultrasonic sensor system based, at least in part, on the one or more properties of the one or more layers.

In some examples, the method may involve controlling a display to present one or more graphical user interfaces. For example, the method may involve controlling a display to present one or more graphical user interfaces corresponding to at least one of a factory calibration process or a fingerprint registration process. Alternatively, or additionally, the method may involve controlling a display to present a graphical user interface prompting a user to ensure that there is no layer residing on the cover glass prior to acquiring the first ultrasonic signals.

In some examples wherein it is determined that one or more layers are residing on the cover glass and that the one or more layers are compatible with the ultrasonic sensor system, the method also may involve controlling a display to present a graphical user interface indicating an ultrasonic sensor system area. According to some such examples, the method may involve prompting a user to ensure that there is no finger or other object in the ultrasonic sensor system area prior to acquiring the second ultrasonic signals. In some examples, the method may involve prompting a user to touch the ultrasonic sensor system area during a fingerprint registration process. According to some such examples, the method may involve controlling the ultrasonic sensor system to acquire third ultrasonic signals at a third time. The third ultrasonic signals may, for example, include registration ultrasonic signals corresponding to reflections from a digit in contact with the ultrasonic sensor system area.

In some examples wherein it is determined that one or more layers are residing on the cover glass and wherein it is determined that the one or more layers are not compatible with the ultrasonic sensor system, the method also may involve controlling a display to present a graphical user interface prompting a user to remove the one or more layers.

Some or all of the operations, functions and/or methods described herein may be performed by one or more devices according to instructions (e.g., software) stored on one or more non-transitory media. Such non-transitory media may include memory devices such as those described herein, including but not limited to random access memory (RAM) devices, read-only memory (ROM) devices, etc. Accordingly, some innovative aspects of the subject matter described in this disclosure can be implemented in one or more non-transitory media having software stored thereon.

For example, the software may include instructions for controlling one or more devices to perform a method of controlling an ultrasonic sensor system. According to some examples, the method may involve acquiring first ultrasonic signals via the ultrasonic sensor system at a first time. The first time may, for example, correspond to at least a portion of a factory calibration process. The first ultrasonic signals may, for example, include reference ultrasonic signals corresponding to reflections from at least one of a cover glass/air interface or a cover glass/target interface.

According to some examples, the method may involve acquiring second ultrasonic signals via the ultrasonic sensor system at a second time. The second time may, for example, correspond to at least a portion of an end user calibration process.

In some examples, the method may involve determining, based at least in part on a comparison of the first ultrasonic signals and the second ultrasonic signals, whether one or more layers reside on a cover glass at the second time. According to some such examples, if it is determined that the one or more layers reside on the cover glass at the second time, the method may involve determining one or more signal characteristics corresponding to one or more properties of the one or more layers and determining, based at least in part on the one or more properties (and/or on the one or more signal characteristics), whether the one or more layers are compatible with the ultrasonic sensor system. The one or more properties may, for example, include thickness, material type and/or material patterning.

According to some implementations, the ultrasonic sensor system may include a piezoelectric layer, an electrode proximate a first side of the piezoelectric layer and an array of ultrasonic sensor pixels proximate a second side of the piezoelectric layer. In some such examples, the first ultrasonic signals and the second ultrasonic signals may be received via the electrode.

In some examples wherein it is determined that the one or more layers are compatible with the ultrasonic sensor system, the method also may involve calibrating the ultrasonic sensor system based, at least in part, on the one or more properties of the one or more layers.

In some examples, the method may involve controlling a display to present one or more graphical user interfaces. For example, the method may involve controlling a display to present one or more graphical user interfaces corresponding to at least one of a factory calibration process or a fingerprint registration process. Alternatively, or additionally, the method may involve controlling a display to present a graphical user interface prompting a user to ensure that there is no layer residing on the cover glass prior to acquiring the first ultrasonic signals.

In some examples wherein it is determined that one or more layers are residing on the cover glass and that the one or more layers are compatible with the ultrasonic sensor system, the method also may involve controlling a display to present a graphical user interface indicating an ultrasonic sensor system area. According to some such examples, the method may involve prompting a user to ensure that there is no finger or other object in the ultrasonic sensor system area prior to acquiring the second ultrasonic signals. In some examples, the method may involve prompting a user to touch the ultrasonic sensor system area during a fingerprint registration process. According to some such examples, the method may involve controlling the ultrasonic sensor system to acquire third ultrasonic signals at a third time. The third ultrasonic signals may, for example, include registration ultrasonic signals corresponding to reflections from a digit in contact with the ultrasonic sensor system area.

In some examples wherein it is determined that one or more layers are residing on the cover glass and wherein it is determined that the one or more layers are not compatible with the ultrasonic sensor system, the method also may involve controlling a display to present a graphical user interface prompting a user to remove the one or more layers.

BRIEF DESCRIPTION OF THE DRAWINGS

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale. Like reference numbers and designations in the various drawings indicate like elements.

FIGS. 4A and 4B show examples of screen protectors residing on cover glasses of devices that include fingerprint sensors.

FIG. 4D shows frequency domain representations of the graphs shown in FIG. 4C.

DETAILED DESCRIPTION

Figure 1:
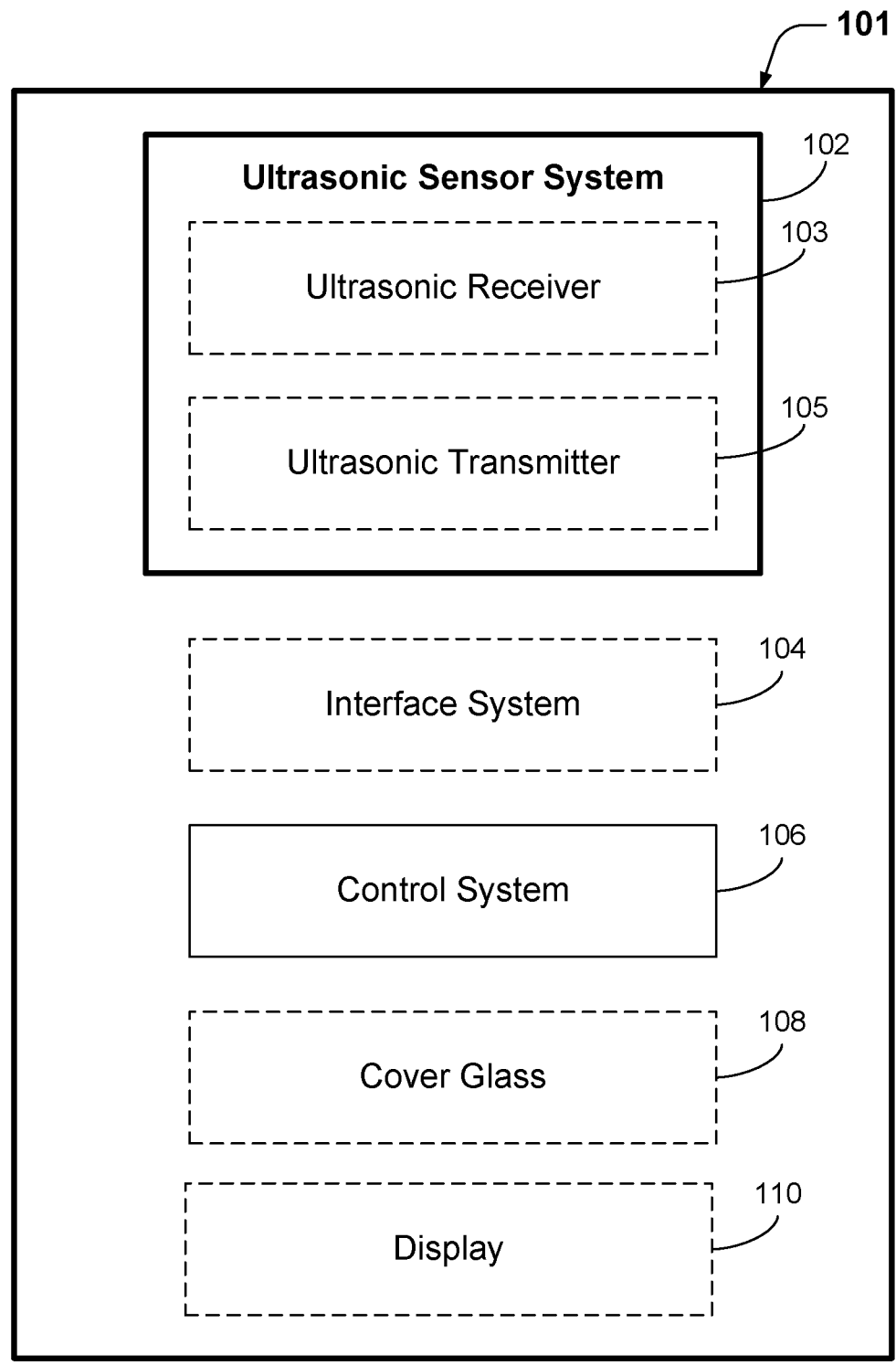
FIG. 1 is a block diagram that shows example components of an apparatus according to some disclosed implementations.

The following description is directed to certain implementations for the purposes of describing the innovative aspects of this disclosure. However, a person having ordinary skill in the art will readily recognize that the teachings herein may be applied in a multitude of different ways. The described implementations may be implemented in any device, apparatus, or system that includes a biometric system as disclosed herein. In addition, it is contemplated that the described implementations may be included in or associated with a variety of electronic devices such as, but not limited to: mobile telephones, multimedia Internet enabled cellular telephones, mobile television receivers, wireless devices, smartphones, smart cards, wearable devices such as bracelets, armbands, wristbands, rings, headbands, patches, etc., Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), mobile health devices, computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also may be used in applications such as, but not limited to, electronic switching devices, radio frequency filters, sensors, accelerometers, gyroscopes, motion-sensing devices, magnetometers, inertial components for consumer electronics, parts of consumer electronics products, steering wheels or other automobile parts, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Many existing products, including but not limited to mobile phones, are configured for fingerprint-based authentication. Some such devices include an ultrasonic fingerprint sensor. It is common for mobile device users to apply or remove screen protective films, device covers, cases, etc. However, ultrasonic fingerprint sensor performance can be significantly affected by the presence of such layers, whether they are laminated film layers, case layers or cover layers. In some instances, a fingerprint sensor may accept a registration of a fingerprint underlying a cover or case, which can cause a false acceptance. Alternatively, or additionally, in some instances an ultrasonic fingerprint sensor may falsely interpret features (e.g., textures or patterns) of a case cover as being fingerprint features.

Some disclosed methods involve acquiring first ultrasonic signals via an ultrasonic sensor system at a first time. The first ultrasonic signals may include reference ultrasonic signals corresponding to reflections from a cover glass/air interface. In some instances, the first time may correspond to a factory calibration process. Some such methods involve acquiring second ultrasonic signals via the ultrasonic sensor system at a second time. The second time may correspond to an end user calibration process. Some such methods involve determining, based at least in part on a comparison of the first ultrasonic signals and the second ultrasonic signals, whether one or more layers reside on the cover glass at the second time. If it is determined that the one or more layers reside on the cover glass at the second time, some methods may involve determining one or more signal characteristics corresponding to properties of the one or more layers and determining, based at least in part on the one or more signal characteristics, whether the one or more layers are compatible with the ultrasonic sensor system. For example, some methods may involve determining whether the ultrasonic sensor system can be properly calibrated while the one or more layers are residing on the cover glass. Alternatively, or additionally, some methods may involve determining whether the one or more layers may present a security risk if they are used with the ultrasonic sensor system. If it is determined that the one or more layers are compatible with the ultrasonic sensor system, the method may involve calibrating the ultrasonic sensor system based, at least in part, on the one or more properties of the one or more layers. If it is determined that the one or more layers are not compatible with the ultrasonic sensor system, the method may involve prompting a user to remove the one or more layers.

Particular implementations of the subject matter described in this disclosure may be implemented to realize one or more of the following potential advantages. Detecting one or more protective film layers, cover layers, a protective case, etc., on an device that includes an ultrasonic sensor and calibrating an ultrasonic sensor accordingly can allow the ultrasonic sensor to function properly. In some instances, such detection and calibration may avoid false acceptances of underlying fingerprints and/or falsely interpreting ultrasonic features (e.g., textures or patterns) of a case cover as being fingerprint features in the phase of registration. According to some examples, the ultrasonic sensor system may include a piezoelectric layer, an electrode proximate a first side of the piezoelectric layer and an array of ultrasonic sensor pixels proximate a second side of the piezoelectric layer. The first ultrasonic signals and the second ultrasonic signals may, in some such examples, be received via the electrode. Such implementations are potentially advantageous for various reasons. One such potential advantage is that there may be a relatively higher signal-to-noise ratio if ultrasonic signals are received via the electrode instead of being received via the array of ultrasonic sensor pixels. Moreover, implementations in which ultrasonic signals can be received via the electrode instead of being received via the array of ultrasonic sensor pixels may be relatively faster, may use relatively less power and may be relatively less costly to operate.

FIG. 1 is a block diagram that shows example components of an apparatus according to some disclosed implementations. In this example, the apparatus 101 includes an ultrasonic sensor system 102 and a control system 106. In some implementations, the apparatus 101 may include an interface system 104 and/or a cover glass 108.

According to this example, the ultrasonic sensor system 102 is, or includes, an ultrasonic fingerprint sensor. In some examples, as suggested by the dashed lines within the ultrasonic sensor system 102, the ultrasonic sensor system 102 may include an ultrasonic receiver 103 and a separate ultrasonic transmitter 105. In some such examples, the ultrasonic transmitter 105 may include an ultrasonic plane-wave generator.

However, various examples of ultrasonic fingerprint sensors are disclosed herein, some of which may include a separate ultrasonic transmitter 105 and some of which may not. Although shown as separate elements in FIG. 1, in some implementations the ultrasonic receiver 103 and the ultrasonic transmitter 105 may be combined in an ultrasonic transceiver system. For example, in some implementations, the ultrasonic sensor system 102 may include a piezoelectric receiver layer, such as a layer of polyvinylidene fluoride PVDF polymer or a layer of polyvinylidene fluoride-trifluoroethylene (PVDF-TrFE) copolymer. In some implementations, a separate piezoelectric layer may serve as the ultrasonic transmitter. In some implementations, a single piezoelectric layer may serve as both a transmitter and a receiver. In some implementations that include a piezoelectric layer, other piezoelectric materials may be used in the piezoelectric layer, such as aluminum nitride (AlN) or lead zirconate titanate (PZT). The ultrasonic sensor system 102 may, in some examples, include an array of ultrasonic transducer elements, such as an array of piezoelectric micromachined ultrasonic transducers (PMUTs), an array of capacitive micromachined ultrasonic transducers (CMUTs), etc. In some such examples, PMUT elements in a single-layer array of PMUTs or CMUT elements in a single-layer array of CMUTs may be used as ultrasonic transmitters as well as ultrasonic receivers.

Data received from the ultrasonic sensor system 102 may sometimes be referred to herein as "ultrasonic image data," "image data," etc., although the data will generally be received from the ultrasonic sensor system in the form of electrical signals. Accordingly, without additional processing such image data would not necessarily be perceivable by a human being as an image.

The control system 106 may include one or more general purpose single- or multi-chip processors, digital signal processors (DSPs), application specific integrated circuits (ASICs), field programmable gate arrays (FPGAs) or other programmable logic devices, discrete gates or transistor logic, discrete hardware components, or combinations thereof. According to some examples, the control system 106 may include a dedicated component for controlling the ultrasonic sensor system 102. The control system 106 also may include (and/or be configured for communication with) one or more memory devices, such as one or more random access memory (RAM) devices, read-only memory (ROM) devices, etc. Accordingly, the apparatus 101 may have a memory system that includes one or more memory devices, though the memory system is not shown in FIG. 1. The control system 106 may be configured for receiving and processing data from the ultrasonic sensor system 102. If the apparatus 101 includes a separate ultrasonic transmitter 105, the control system 106 may be configured for controlling the ultrasonic transmitter 105. In some implementations, functionality of the control system 106 may be partitioned between one or more controllers or processors, such as between a dedicated sensor controller and an applications processor of a mobile device.

Some implementations of the apparatus 101 may include an interface system 104. In some examples, the interface system 104 may include a wireless interface system. In some implementations, the interface system 104 may include a user interface system, one or more network interfaces, one or more interfaces between the control system 106 and a memory system, and/or one or more interfaces between the control system 106 and one or more external device interfaces (e.g., ports or applications processors).

The interface system 104 may be configured to provide communication (which may include wired or wireless communication, electrical communication, radio communication, etc.) between components of the apparatus 101. In some such examples, the interface system 104 may be configured to provide communication between the control system 106 and the ultrasonic sensor system 102. According to some such examples, the interface system 104 may couple at least a portion of the control system 106 to the ultrasonic sensor system 102, e.g., via electrically conducting material (e.g., via conductive metal wires or traces. If the apparatus 101 includes an ultrasonic transmitter 105 that is separate from the ultrasonic receiver 103, the interface system 104 may be configured to provide communication between at least a portion of the control system 106 and the ultrasonic transmitter 105. According to some examples, the interface system 104 may be configured to provide communication between the apparatus 101 and other devices and/or human beings. In some such examples, the interface system 104 may include one or more user interfaces. The interface system 104 may, in some examples, include one or more network interfaces and/or one or more external device interfaces (such as one or more universal serial bus (USB) interfaces or a serial peripheral interface (SPI)). In some implementations, the apparatus 101 may include a memory system. The interface system 104 may, in some examples, include at least one interface between the control system 106 and a memory system.

According to some examples, the apparatus 101 may include a cover glass 108. The cover glass may or may not actually be made of glass, depending on the particular implementation. The cover glass 108 may be formed of any appropriate material, such as glass, a hard plastic, etc. If the cover glass 108 overlies a display, the cover glass 108 is preferably formed of transparent material.

In some implementations, the apparatus 101 may include a display 110. For example, the apparatus 101 may include layers of a display, which layers may be referred to herein as a "display stack." In some examples, the display 110 may be, or may include, a light-emitting diode (LED) display, such as an organic light-emitting diode (OLED) display.

The apparatus 101 may be used in a variety of different contexts, some examples of which are disclosed herein. For example, in some implementations a mobile device may include at least a portion of the apparatus 101. In some implementations, a wearable device may include at least a portion of the apparatus 101. The wearable device may, for example, be a bracelet, an armband, a wristband, a ring, a headband or a patch. In some implementations, the control system 106 may reside in more than one device. For example, a portion of the control system 106 may reside in a wearable device and another portion of the control system 106 may reside in another device, such as a mobile device (e.g., a smartphone). The interface system 104 also may, in some such examples, reside in more than one device.

Figure 2:
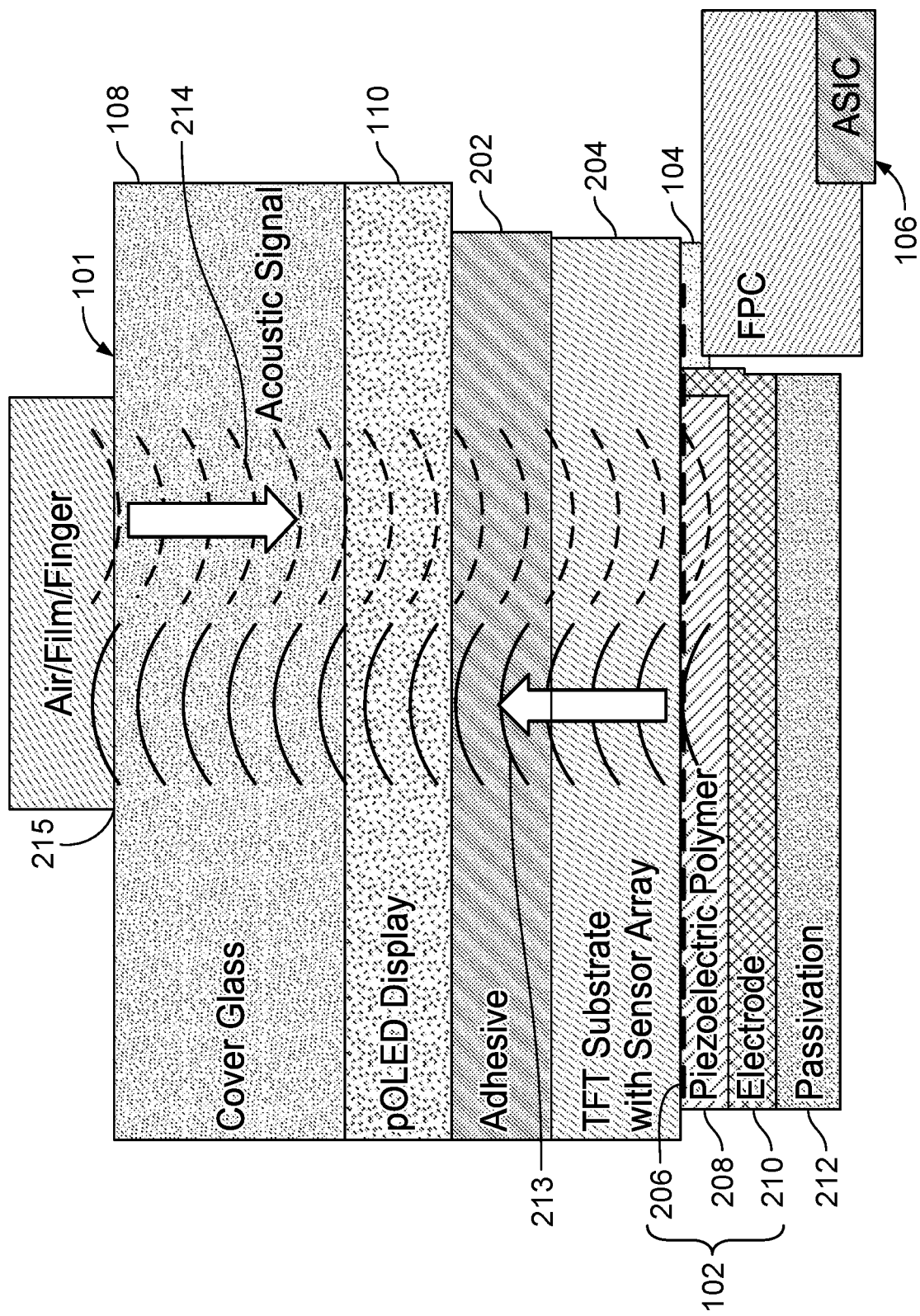
FIG. 2 shows example components of an apparatus according to some disclosed implementations.

FIG. 2 shows example components of an apparatus according to some disclosed implementations. As with other disclosed implementations, the types, number and arrangement of elements, as well as the dimensions of elements, are merely examples. According to this example, the apparatus 101 is configured to perform at least some of the methods disclosed herein. According to this implementation, the apparatus 101 has an ultrasonic sensor system 102 that includes a piezoelectric layer 208, an electrode layer 210 on one side of the piezoelectric layer 208 and an array of sensor pixels 206 on a second and opposing side of the piezoelectric layer 208. In this implementation, the piezoelectric layer 208 is an ultrasonic transceiver layer that includes one or more piezoelectric polymers.

According to this example, the electrode layer 210 resides between a passivation layer 212 and the piezoelectric layer 208. In some examples, passivation layer 212 may include an adhesive, such as an epoxy film, a polymer layer (such as a polyethylene terephthalate (PET) layer), etc.

In this example the thin-film transistor (TFT) layer 204 includes a TFT substrate and circuitry for the array of sensor pixels 206. The TFT layer 204 may be a type of metal-oxide-semiconductor field-effect transistor (MOSFET) made by depositing thin films of an active semiconductor layer as well as a dielectric layer and metallic contacts over a TFT substrate. In some examples, the TFT substrate may be a non-conductive material such as glass.

In this example, the apparatus 101 includes a display 110, which is an OLED display in this instance. Here, the display 110 is attached to the TFT layer 204 via an adhesive layer 202.

According to this implementation, the TFT layer 204, the array of sensor pixels 206 and the electrode are electrically coupled to at least a portion of the control system 106 and one side of the ultrasonic transceiver layer 101 via a portion of the interface system 104, which includes electrically conducting material and a flexible printed circuit (FPC) in this instance.

In this example, the apparatus 101 is configured to perform at least some of the methods disclosed herein. In this example, the control system 106 is configured to control the ultrasonic sensor system 102 to transmit one or more ultrasonic waves 213. According to this example, the ultrasonic wave(s) 213 are transmitted through the TFT layer 204, the display 110 and the cover glass 108. According to this example, reflections 214 of the ultrasonic wave(s) 213 are caused by acoustic impedance contrast at (or near) the interface 215 between the outer surface of the cover glass 108 and whatever is in contact with the outer surface, which may be air, one or more protective layers (e.g., of a protective film, cover or case), ridges and valleys of a fingerprint, etc. (As used herein, the term "finger" may refer to any digit, including a thumb. Accordingly, a thumbprint will be considered a type of "fingerprint.")

Figure 3:
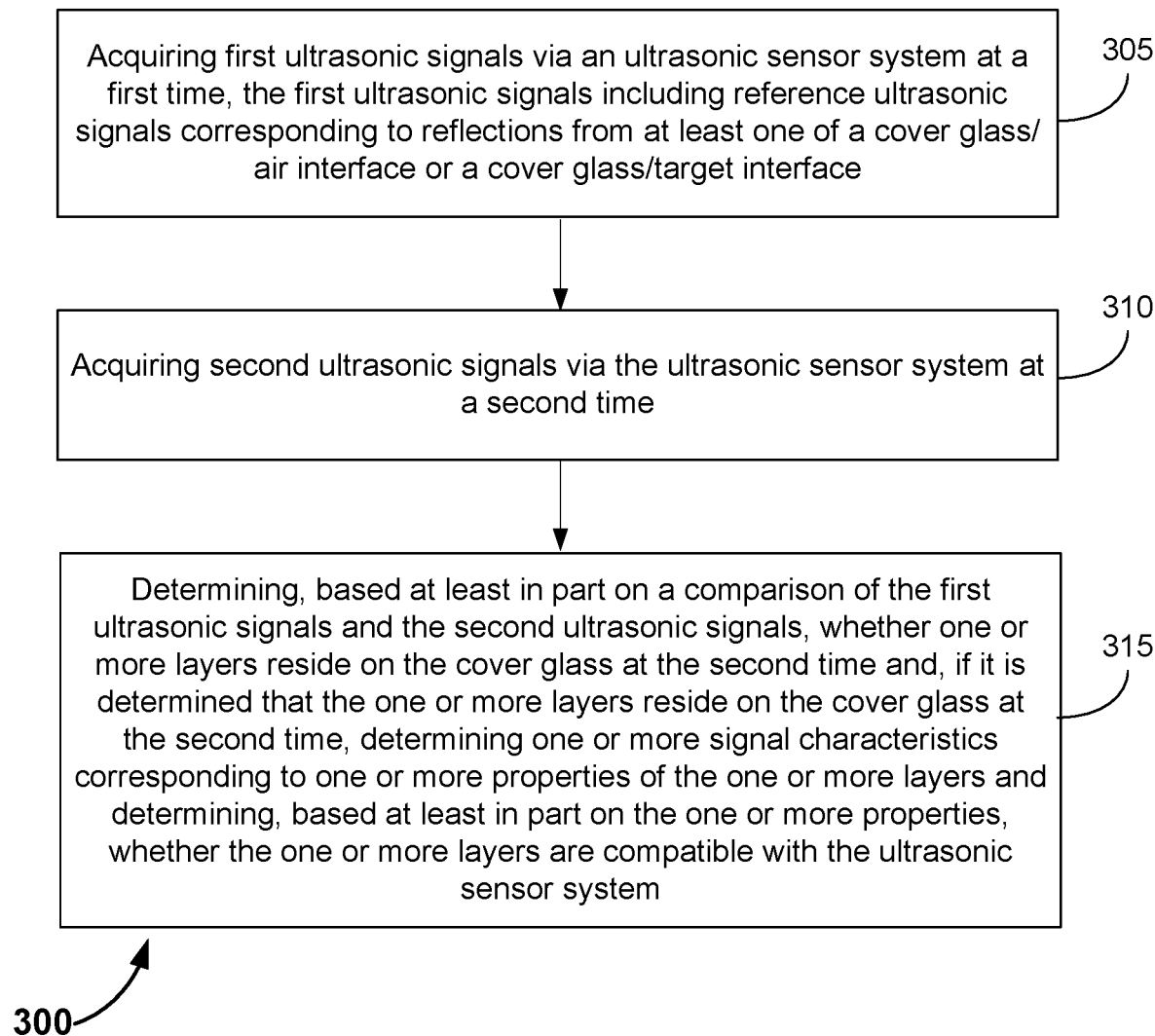
FIG. 3 is a flow diagram that provides examples of operations according to some disclosed methods.

FIG. 3 is a flow diagram that provides examples of operations according to some disclosed methods. The blocks of FIG. 3 may, for example, be performed by the apparatus 101 of FIG. 1 or 2, or by a similar apparatus. As with other methods disclosed herein, the method outlined in FIG. 3 may include more or fewer blocks than indicated. Moreover, the blocks of methods disclosed herein are not necessarily performed in the order indicated. In some instances, one or more blocks may be performed concurrently.

In this example, block 305 involves acquiring first ultrasonic signals via an ultrasonic sensor system at a first time. For example, block 305 may involve the control system 106 of FIG. 1 or FIG. 2 controlling the ultrasonic sensor system 102 to acquire first ultrasonic signals at a first time. In some examples, the "first time" may correspond to a factory calibration process. In some such examples, the "first time" may correspond to the first time that the ultrasonic sensor system and/or a device that includes the ultrasonic sensor system, is booted up for the first time.

According to this example, the first ultrasonic signals include reference ultrasonic signals corresponding to reflections from a cover glass/air interface and/or a cover glass/target interface. In some such implementations, the reference ultrasonic signals corresponding to reflections from a cover glass/air interface are obtained because at the first time there is no protective film, protective cover, etc. on the cover glass of the ultrasonic sensor system, or on the cover glass of a device that includes the ultrasonic sensor system. Alternatively, or additionally, the reference ultrasonic signals may correspond to reflections from a cover glass/target interface. The cover glass/target interface may correspond to a target, such as an alignment target, that is in contact with the cover glass during the first time. Such reference ultrasonic signals may, for example, be obtained when the "first time" corresponds to a factory calibration process. In alternative implementations (e.g., wherein the apparatus is shipped to end users with a protective film on the cover glass), the reference ultrasonic signals may correspond to reflections from another interface, such as a protective film/air interface.

In some implementations, for example as shown in FIG. 2, the ultrasonic sensor system may include a piezoelectric layer, an electrode proximate a first side of the piezoelectric layer and an array of the ultrasonic sensor system includes a piezoelectric layer, an electrode proximate a first side of the piezoelectric layer and an array of ultrasonic sensor pixels proximate a second side of the piezoelectric layer. According to some such implementations, the first ultrasonic signals may be received via the electrode instead of, or in addition to, being received via one or more of the ultrasonic sensor pixels. Such implementations are potentially advantageous, at least in part because there may be a relatively higher signal-to-noise ratio if ultrasonic signals are received via the electrode instead of being received via the array of ultrasonic sensor pixels and the corresponding TFT circuitry. Moreover, implementations in which ultrasonic signals can be received via the electrode instead of being received via the array of ultrasonic sensor pixels may be relatively faster, may use relatively less power and may be relatively less costly to operate. However, in alternative implementations, the first ultrasonic signals may be received via one or more of the ultrasonic sensor pixels.

According to this example, block 310 involves acquiring second ultrasonic signals via the ultrasonic sensor system at a second time. For example, block 310 may involve the control system 106 of FIG. 1 or FIG. 2 controlling the ultrasonic sensor system 102 to acquire second ultrasonic signals at the second time. In some instances, the "second time" may correspond to an end user calibration process. For example, the second time may correspond to the first time that an end user turns on a device that includes the ultrasonic sensor system.

Some implementations may involve controlling a display to present one or more graphical user interfaces corresponding to a factory calibration process and/or a fingerprint registration process. Some examples are disclosed herein and described below. Some such implementations may involve controlling a display to present a graphical user interface prompting a user to ensure that there is no layer residing on the cover glass prior to acquiring the first ultrasonic signals. Alternatively, or additionally, some implementations may involve controlling a display to present a graphical user interface indicating an ultrasonic sensor system area and prompting a user to ensure that there is no finger or other object in the ultrasonic sensor system area prior to acquiring the second ultrasonic signals.

According to some examples, blocks 305 and 310 may involve acquiring the first ultrasonic signals and the second ultrasonic signals by controlling the ultrasonic sensor system to transmit ultrasonic waves that include a range of frequencies, e.g., a range of 10 MHz to 15 MHz, 9 MHz to 15 MHz, 10 MHz to 16 MHz, 10 MHz to 14 MHz, etc. Some implementations of the ultrasonic sensor system may be configured to transmit "broadband" ultrasonic waves that include the entire range of frequencies, or may be configured to sweep a range of ultrasonic waves at a series of peak frequencies that spans the entire range of frequencies. Other implementations of the ultrasonic sensor system may need to transmit multiple instances of ultrasonic waves (e.g., multiple bursts) in order to include the entire range of frequencies. Whether a single broadband transmission, a sweep that includes a range of frequencies or a series of individual instances of transmission, the ultrasonic wave transmission process corresponding to blocks 305 and 310 may be thought of as occurring at the "first time" or the "second time."

In this example, block 315 involves determining, based at least in part on a comparison of the first ultrasonic signals and the second ultrasonic signals, whether one or more layers reside on the cover glass at the second time. According to this example, if it is determined that the one or more layers reside on the cover glass at the second time, block 315 also involves determining one or more signal characteristics corresponding to one or more properties of the one or more layers. In some instances, the properties may include layer thickness, material type and/or material patterning. According to some examples, additional ultrasonic signals may be obtained to determine the properties. The signal characteristics may include frequency, amplitude, phase and/or combinations thereof. In this example, block 315 involves determining, based at least in part on the one or more signal characteristics, whether the one or more layers are compatible with the ultrasonic sensor system. For example, determining whether the one or more layers are compatible with the ultrasonic sensor system may involve determining whether the ultrasonic sensor system can be properly calibrated while the one or more layers are residing on the cover glass. In some such examples, determining whether the one or more layers are compatible with the ultrasonic sensor system may involve determining whether a stored set of ultrasonic fingerprint sensor parameters corresponds with the one or more layers are residing on the cover glass. The stored set of ultrasonic fingerprint sensor parameters may, for example, reside in a data structure that includes compatible protective film, cover or case types and corresponding sets of ultrasonic fingerprint sensor parameters. Alternatively, or additionally, determining whether the one or more layers are compatible with the ultrasonic sensor system may involve determining whether the one or more layers may present a security risk if they are used with the ultrasonic sensor system.

In some instances, block 315 may involve determining that the one or more layers are compatible with the ultrasonic sensor system. According to some such implementations, the method 300 may involve calibrating the ultrasonic sensor system based, at least in part, on the one or more properties of the detected layer(s).

Calibrating the ultrasonic sensor system may involve determining at least one ultrasonic fingerprint sensor parameter modification and updating at least one setting of the ultrasonic fingerprint sensor based, at least in part, on the ultrasonic fingerprint sensor parameter modification. In some instances, the ultrasonic fingerprint sensor parameter modification(s) may include a gain value modification, a modification of a peak frequency of a transmitted ultrasonic wave, a range gate delay modification, a range gate window modification, a modification of an applied voltage and/or a modification of a voltage bias condition. Examples of these parameters are described below with reference to corresponding figures. According to some examples, determining the ultrasonic fingerprint sensor parameter modification(s)

may involve obtaining one or more new ultrasonic fingerprint sensor parameters from a data structure. For example, determining the ultrasonic fingerprint sensor parameter modification(s) may involve obtaining a set of ultrasonic fingerprint sensor parameters from a portion of a data structure corresponding to a previously-evaluated type of protective film, protective cover, protective case, etc. The data structure may include protective film, cover or case types and corresponding sets of ultrasonic fingerprint sensor parameters. The data structure may, for example, have previously been saved to a memory of a device that includes the ultrasonic fingerprint sensor, e.g., during a factory calibration process.

TABLE 1

| Layer Type | VBOOST | DBIAS | Integration Time | Peak Frequency | RGD | RGW |
|---|---|---|---|---|---|---|
| 2A | 25 V | 6.5 V | 1.5 us | 12 MHz | 1.25 us | 0.02 us |

Table 1 provides a simple example of a portion of one such data structure. In Table 1, an example of a set of ultrasonic fingerprint sensor parameters corresponding to a particular protective layer type (type "2A") is shown. In this example, the set of ultrasonic fingerprint sensor parameters includes a voltage boost (VBOOST) of 25 Volts, a bias Voltage (DBIAS) of 6.5 Volts, an integration time of 1.5 microseconds, a range-gate delay (RGD) of 1.25 microseconds and a range gate window (RGW) of 0.02 microseconds. The meanings of the terms DBIAS, RGD and RGW, along with illustrative examples, are discussed below with reference to FIGS. 5 and 6. "Integration time" corresponds to the time period in which a pixel is enabled to sense for each tone burst. It is a good indicator of the system latency. The voltage boost VBOOST refers to the boost voltage applied to the transmitter. VBOOST can be adjusted, in some examples, via a sequencer.

In some instances, block 315 may involve determining that the one or more layers are not compatible with the ultrasonic sensor system. As noted above, in some instances an ultrasonic fingerprint sensor may falsely interpret ultrasonic features (e.g., textures or patterns) of a case cover as being fingerprint features, e.g., during a registration process. If such patterns have, in the past, led to such false positives, block 315 may involve determining that the one or more layers are not compatible with the ultrasonic sensor system. In some instances, block 315 may involve determining that the thickness and/or material type of one or more detected layers mean that the one or more layers are not compatible with the ultrasonic sensor system. In some implementations wherein block 315 involves determining that the one or more layers are not compatible with the ultrasonic sensor system, the method 300 may involve controlling a display to present a graphical user interface prompting a user to remove the one or more layers. Some implementations may involve further processes of determining whether the one or more layers have been removed (e.g., by acquiring more ultrasonic signals corresponding to the outer surface of the cover glass). Some such processes may involve a further calibration process, if necessary.

After the ultrasonic sensor system is calibrated (whether according to a factory calibration process or an end user calibration process), some implementations involve a subsequent fingerprint registration process. Some such implementations may involve controlling a display to present a graphical user interface indicating an ultrasonic sensor system area and prompting a user to touch the ultrasonic sensor system area during the fingerprint registration process. Additional examples of graphical user interfaces for a fingerprint registration process are described below. Some fingerprint registration processes involve controlling the ultrasonic sensor system to acquire third ultrasonic signals at a third time. The third ultrasonic signals may include registration ultrasonic signals corresponding to reflections from a digit in contact with the ultrasonic sensor system area.

In some examples, the control system 106 of FIG. 1 or FIG. 2 may be configured to receive, from the ultrasonic sensor system 102, signals corresponding to reflections of ultrasonic waves from a surface of a portion of a target object, such as a finger, that is on an outer surface of the cover glass 108 or on the outer surface of one or more detected layers that reside on the cover glass 108. In some examples, the control system 106 may be configured to obtain fingerprint data based on portions of the reflected ultrasonic waves that are received within a time interval corresponding with fingerprints. The time interval may, for example, be measured relative to a time at which ultrasonic waves corresponding to the third ultrasonic signals are transmitted. Obtaining the fingerprint data may, for example, involve extracting, via the control system 106, fingerprint features from the first signals. According to some examples, the fingerprint features may include fingerprint minutiae, keypoints and/or sweat pores. In some examples, the fingerprint features may include ridge ending information, ridge bifurcation information, short ridge information, ridge flow information, island information, spur information, delta information, core information, etc.

In some examples, the control system 106 may be configured to perform a subsequent authentication process that is based, at least in part, on the fingerprint features. According to some examples, the control system 106 may be configured to compare the fingerprint features with subsequently-obtained features of target object, such as a finger.

In some implementations, the control system 106 may be configured to extract sub-epidermal features from the third ultrasonic signals, or from other ultrasonic signals. In some such implementations, the sub-epidermal features may include sub-epidermal layer information corresponding to reflections received within a time interval corresponding with a sub-epidermal region. According to some implementations, a subsequent authentication process may involve comparing sub-epidermal features extracted from the third ultrasonic signals with subsequently-obtained sub-epidermal features.

The sub-epidermal features may, for example, include dermis layer information corresponding to reflections corresponding to the third ultrasonic signals, or to other ultrasonic signals. The dermis layer information may have been obtained within a time interval corresponding with a dermis layer. The subsequent authentication process may be based, at least in part, on the dermis layer information. Alternatively, or additionally, the sub-epidermal features may include information regarding other sub-epidermal layers, such as the papillary layer, the reticular layer, the subcutis, etc., and any blood vessels, lymph vessels, sweat glands, hair follicles, hair papilla, fat lobules, etc., that may be present within such tissue layers.

In some examples, the control system 106 may be configured for controlling access to the apparatus 101, or to another device, based at least in part on the subsequent authentication process. For example, in some implementations a mobile device (such as a cell phone) may include the apparatus 101. In some such examples, the control system

106 may be configured for controlling access to the mobile device based, at least in part, on the subsequent authentication process.

In some implementations an Internet of things (IoT) device may include the apparatus 101. For example, in some such implementations a device intended for use in a home, such as a remote control device (such as a remote control device for a smart television), a stove, an oven, a refrigerator, a stove, a coffee maker, an alarm system, a door lock, a mail/parcel box lock, a thermostat, etc., may include the apparatus 101. In some such examples, the control system may be configured for controlling access to the IoT device based, at least in part, on the subsequent authentication process.

In alternative implementations, an automobile (including but not limited to a partially or fully autonomous automobile), a partially or fully autonomous delivery vehicle, a drone, or another device typically used outside of the home may include the apparatus 101. In some such examples, the control system may be configured for controlling access to the vehicle, the drone, etc., based at least in part on the subsequent authentication process.

In some examples, including but not limited to many IoT implementations, there may be a metal, plastic, ceramic or polymer layer between an outer surface of the apparatus 101, or an outer surface of a device that includes the apparatus 101. In such implementations, the acoustic waves transmitted towards, and reflected from, a finger or other target may need to pass through the metal, plastic, ceramic or polymer layer. Ultrasound and other acoustic waves can be successfully transmitted through e.g., a metal layer, whereas some other types of waves (e.g., light waves) cannot. Similarly, ultrasound and other acoustic waves can be successfully transmitted through an optically opaque plastic, ceramic or polymer layer, whereas some other types of waves, such as light waves, cannot. This feature is another potential advantage of some disclosed implementations, as compared to devices that rely upon optical or capacitive fingerprint sensors.

FIGS. 4A and 4B show examples of screen protectors residing on cover glasses of devices that include fingerprint sensors. In these examples, the illustrated fingerprint sensors are instances of the ultrasonic sensor system 102 that is shown in FIG. 1, the OLED display stacks are instances of the display 110 shown in FIG. 1 and the cover glasses are instances of the cover glass 108 shown in FIG. 1.

The plastic film screen protector 400a of FIG. 4A and the tempered glass screen protector 400b of FIG. 4B are examples of the "one or more layers" residing on the cover glass 108 described above, e.g., with reference to block 315 of FIG. 3. The plastic film screen protector 400a includes alternating layers of adhesive 402 and plastic 404. The tempered glass screen protector 400b includes an adhesive layer 402, a glass layer 408 and an anti-shatter film disposed between the adhesive layer 402 and the glass layer 408.

Figure 4C:
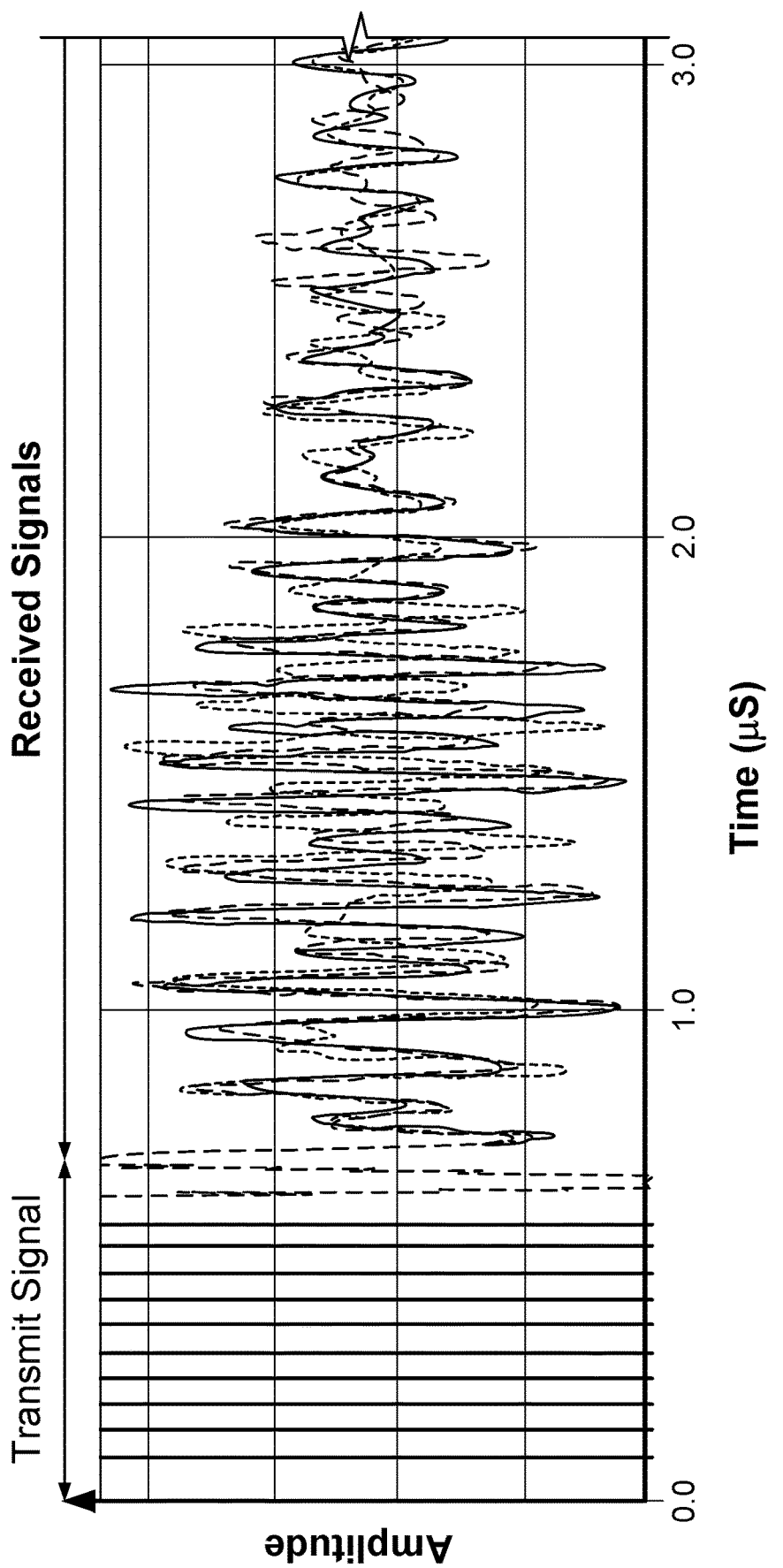
FIG. 4C shows three superimposed graphs of ultrasonic signals received via an electrode.
Figure 4C:
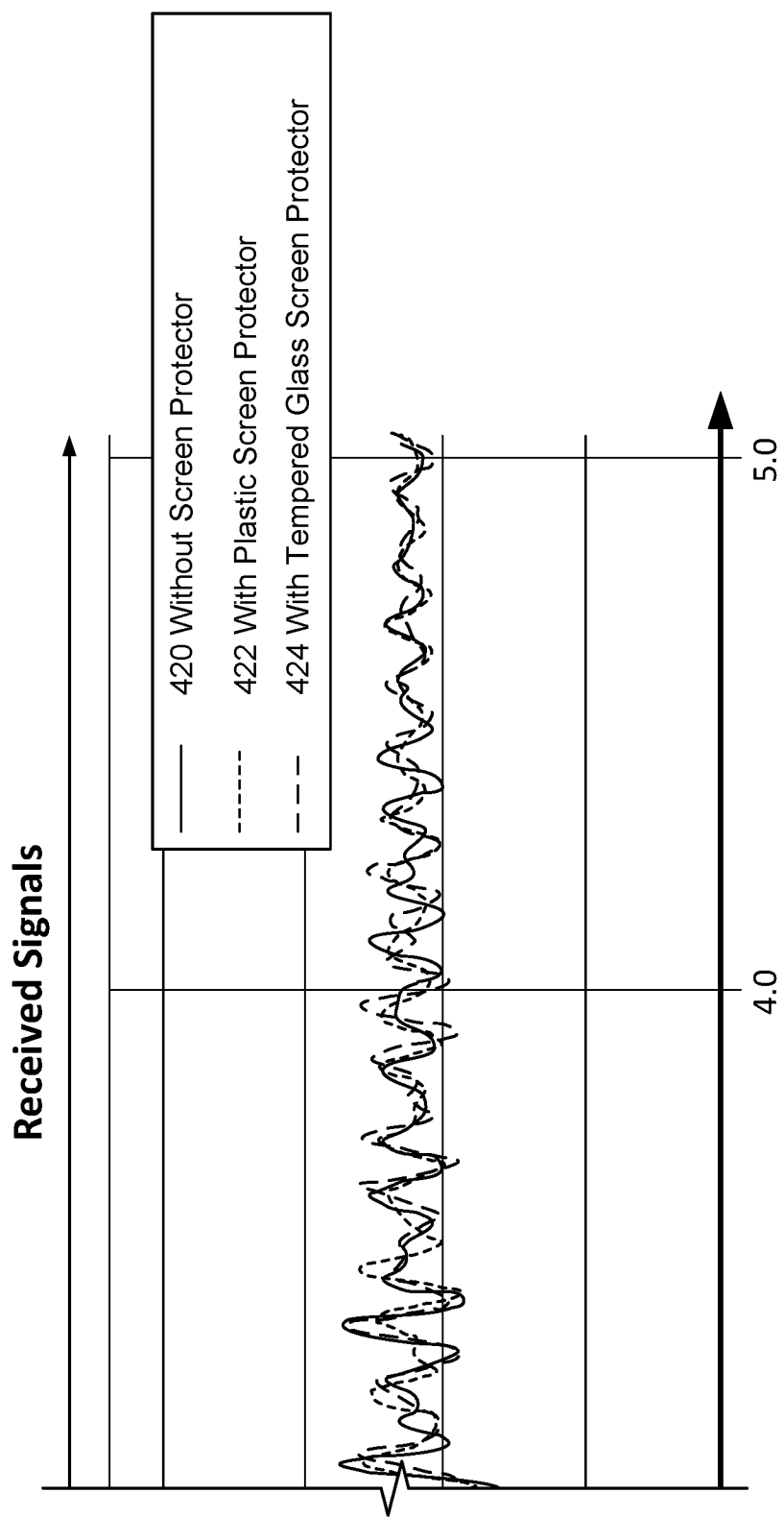

FIG. 4C shows three superimposed graphs of ultrasonic signals received via an electrode. The electrode may, in some examples, be the electrode 210 of FIG. 2 or a similar electrode. In FIG. 4C, the dashed line 422 corresponds to ultrasonic signals received from a device having a plastic screen protector, such as the plastic film screen protector 400a of FIG. 4A, on its cover glass. In this example, the dashed line 424 corresponds to ultrasonic signals received from a device having a tempered glass screen protector, such as the tempered glass screen protector 400b of FIG. 4B, on its cover glass. In FIG. 4C, the solid line 420 corresponds to ultrasonic signals received from a device having no screen protector on its cover glass.

In FIG. 4C, the horizontal axis represents time in microseconds and the vertical axis represents signal amplitude. In this example, the graphs are scaled so that the received waveforms are clearly visible. As a consequence of this scaling, the transmit waveform was clipped because the amplitude of transmit waveform is very high compared to that of the received signals. In this example, the transmit signal includes five pulses at 9 MHz, with a gradual ramp up and ramp down of amplitude. In other examples, a transmit waveform may include between 0.5 and 20 pulses at single frequency, a chirp waveform that contains many frequencies, or another type of broadband waveform. According to some such examples, the frequencies may be in a range between 5 MHz and 20 MHz.

Even in the time domain representation that is shown in FIG. 4C, the signals received from the device with no screen protector may be distinguished from the signals received from the device with a plastic screen protector and from the signals received from the device with a tempered glass screen protector. As shown in FIG. 4C, the received waveforms have distinctive signal characteristics, including but not limited to amplitude information, phase information, etc., corresponding to properties of the "one or more layers" of the screen protectors. These signal characteristics may be analyzed and characterized to detect a screen protector and to distinguish one type of screen protector from another.

FIG. 4D shows frequency domain representations of the graphs shown in FIG. 4C. In FIG. 4D, the dashed line 422' corresponds to a fast Fourier transform (FFT) of the time-domain ultrasonic signals 422 shown in FIG. 4C, the dashed line 424' corresponds to an FFT of the time-domain ultrasonic signals 422 shown in FIG. 4C and the solid line 420' corresponds to an FFT of the time-domain ultrasonic signals 420 shown in FIG. 4C.

It may be observed that the frequency domain representations of these graphs are readily distinguishable from one another, particularly in the frequency range between 10.6 MHz and 13.8 MHz. For example, at approximately 12 MHz the curve 420' (corresponding to the device with no screen protector) reaches its highest magnitude, whereas the curve 422' (corresponding to the device with a plastic screen protector) is at a much lower magnitude. At between 11.8 MHz and 11.9 MHz, the curve 424' (corresponding to the device with a tempered glass screen protector) reaches its highest magnitude, whereas the curve 422' reaches one of its lowest magnitudes. Accordingly, these signal characteristics may be analyzed and characterized to detect a screen protector and to distinguish one type of screen protector from another.

Figure 5:
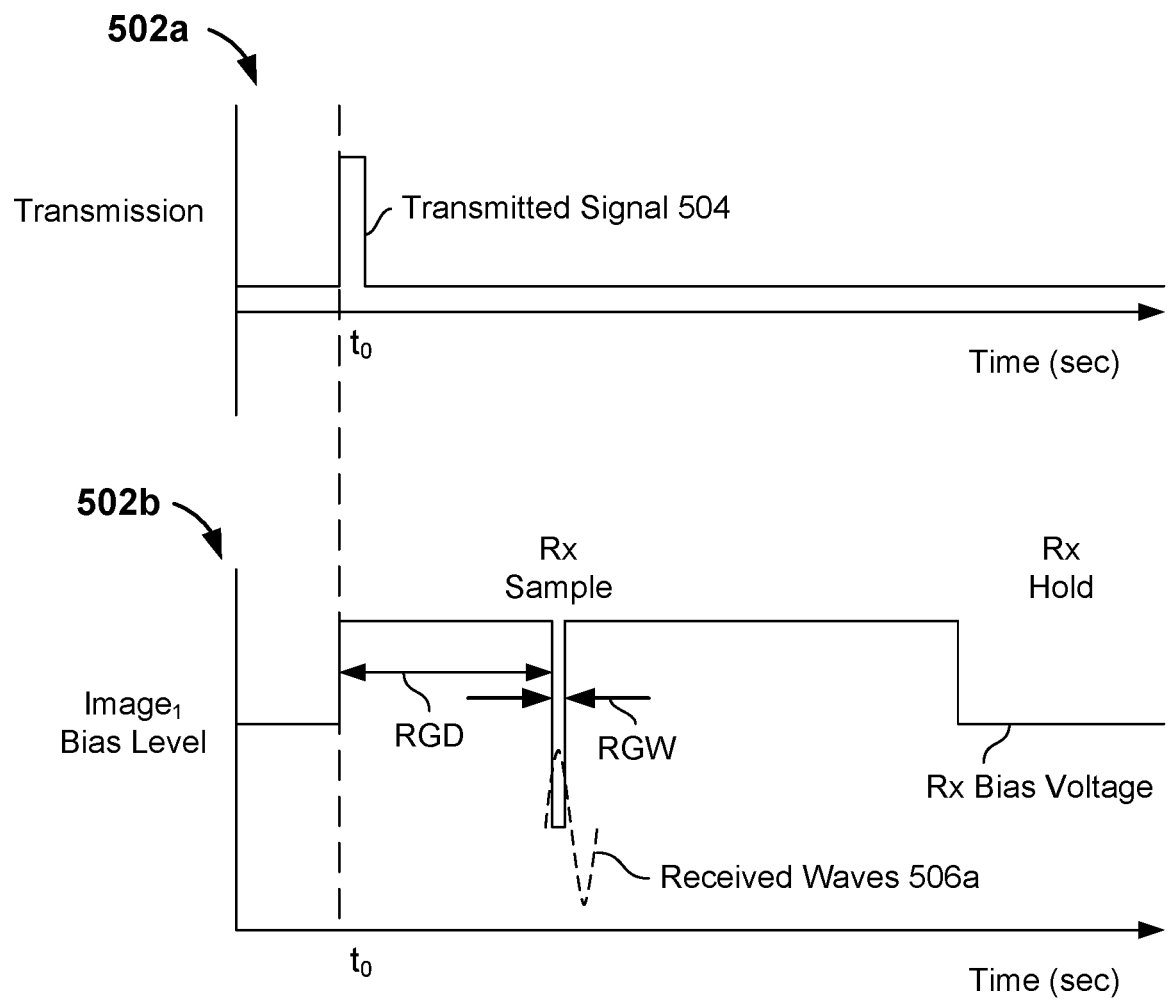
FIG. 5 shows examples of acquisition time delays and acquisition time windows according to some implementations.

FIG. 5 shows examples of acquisition time delays and acquisition time windows according to some implementations. Acquisition time delays may sometimes be referred to herein as range gate delays or RGDs. Acquisition time windows may sometimes be referred to herein as range gate windows or RGWs. These examples of RGDs and RGWs may, for example, be suitable for acquiring fingerprint data. However, FIG. 5 and the corresponding discussion also provide examples of ultrasonic fingerprint sensor parameters that may be applied in a calibration or recalibration process such as those disclosed herein.

FIG. 5 provides an example of what may be referred to herein as "DBIAS sampling," in which the receiver bias voltage level changes when a signal is sampled. In this example, the receiver bias voltage level also changes when a signal is transmitted. In FIG. 5, an acquisition time delay is labeled as "RGD," an acronym for "range-gate delay," and an acquisition time window is labeled as "RGW," an acronym for "range-gate window." Graph 502a shows a transmitted signal 504 that is initiated at a time to. The transmitted signal 504 may, for example, be a pulse of ultrasound.

Graph 502b shows examples of an acquisition time delay RGD and an acquisition time window RGW. The received waves 506a represent reflected ultrasonic waves that are received by an ultrasonic sensor array and sampled during the acquisition time window RGW, after the acquisition time delay RGD. In some examples, the acquisition time delay may be in the range of about 10 nanoseconds to about 20,000 nanoseconds or more. In some implementations, the acquisition time window may be in the range of 5 to 50 nanoseconds, or in the range of approximately 5 to 50 nanoseconds. In some examples, "approximately" or "about" may mean within +/−5%, whereas in other examples "approximately" or "about" may mean within +/−10%, +/−15% or +/−20%. However, in some implementations the first acquisition time window may be more than 50 nanoseconds.

According to some examples, a factory-calibrated acquisition time delay may correspond to an expected amount of time for an ultrasonic wave reflected from a surface of a cover glass to be received by at least a portion of the ultrasonic sensor system 102 (e.g., by an array of sensor pixels). Accordingly, the acquisition time delay and the acquisition time window may be selected to capture fingerprint features of a target object placed on a surface of the cover glass. For example, in some implementations with a cover glass about 400 microns thick, the acquisition time delay (RGD) may be set to about 1,000 nanoseconds and the acquisition time window (RGW) may be set to about 50 nanoseconds.

If it is determined in block 315 that one or more layers reside on the cover glass at the second time and that the one or more layers are compatible with the ultrasonic sensor system, one ultrasonic fingerprint sensor parameter modification may correspond to a detected thickness of the one or more layers and a previously-measured, or estimated, acoustic velocity of the one or more layers. For example, if the thickness and acoustic velocity of the one or more layers indicate that the expected amount of time for an ultrasonic wave reflected from an out surface of one or more layers to be received by the array of sensor pixels will increase by 400 nanoseconds, the RGD may be recalibrated to 1400 nanoseconds. In some examples, the recalibration also may involve changing the peak frequency, bias voltage, applied voltage (e.g., for ultrasonic transmission) or other fingerprint sensor operating parameters in accordance with one or more layer properties. In some such implementations, the recalibration may involve retrieving a set of fingerprint sensor operating parameters that corresponds with a detected protective film, protective cover, etc., that corresponds with the one or more signal characteristics and/or properties determined in block 315. The set of fingerprint sensor operating parameters may, for example, be retrieved from a data structure stored in a memory of a device that includes the ultrasonic sensor system.

Figure 6:
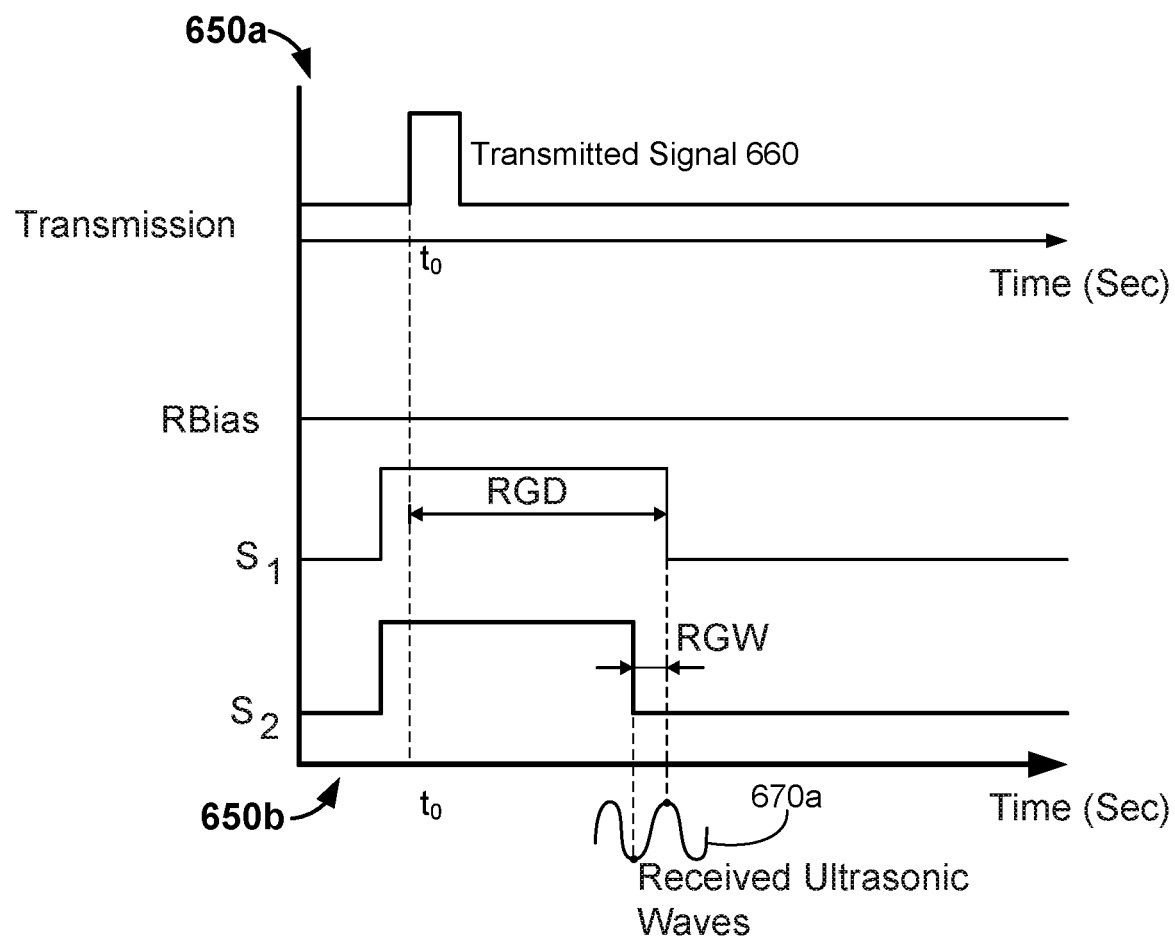
FIG. 6 shows examples of an acquisition time delays and an acquisition time window according to some implementations of peak-to-peak sampling.

FIG. 6 shows examples of an acquisition time delays and an acquisition time window according to some implementations of peak-to-peak sampling. Graph 650a shows a transmitted signal 660 that is initiated at a time to. The transmitted signal 660 may, for example, be a pulse of ultrasound. In alternative examples, multiple pulses of ultrasound may be transmitted.

Graph 650b shows examples of an acquisition time delay RGD and an acquisition time window RGW. The received waves 670a represent reflected ultrasonic waves that are received by an ultrasonic sensor array and sampled during first acquisition time window RGW, after the acquisition time delay RGD. In some examples, the acquisition time delay may be in the range of about 10 nanoseconds to about 20,000 nanoseconds or more. In some implementations, the acquisition time window may be in the range of 5 to 50 nanoseconds, or in the range of approximately 5 to 50 nanoseconds. In some examples, "approximately" or "about" may mean within +/−5%, whereas in other examples "approximately" or "about" may mean within +/−10%, +/−15% or +/−20%. However, in some implementations the acquisition time window may be more than 50 nanoseconds.

Figure 7A:
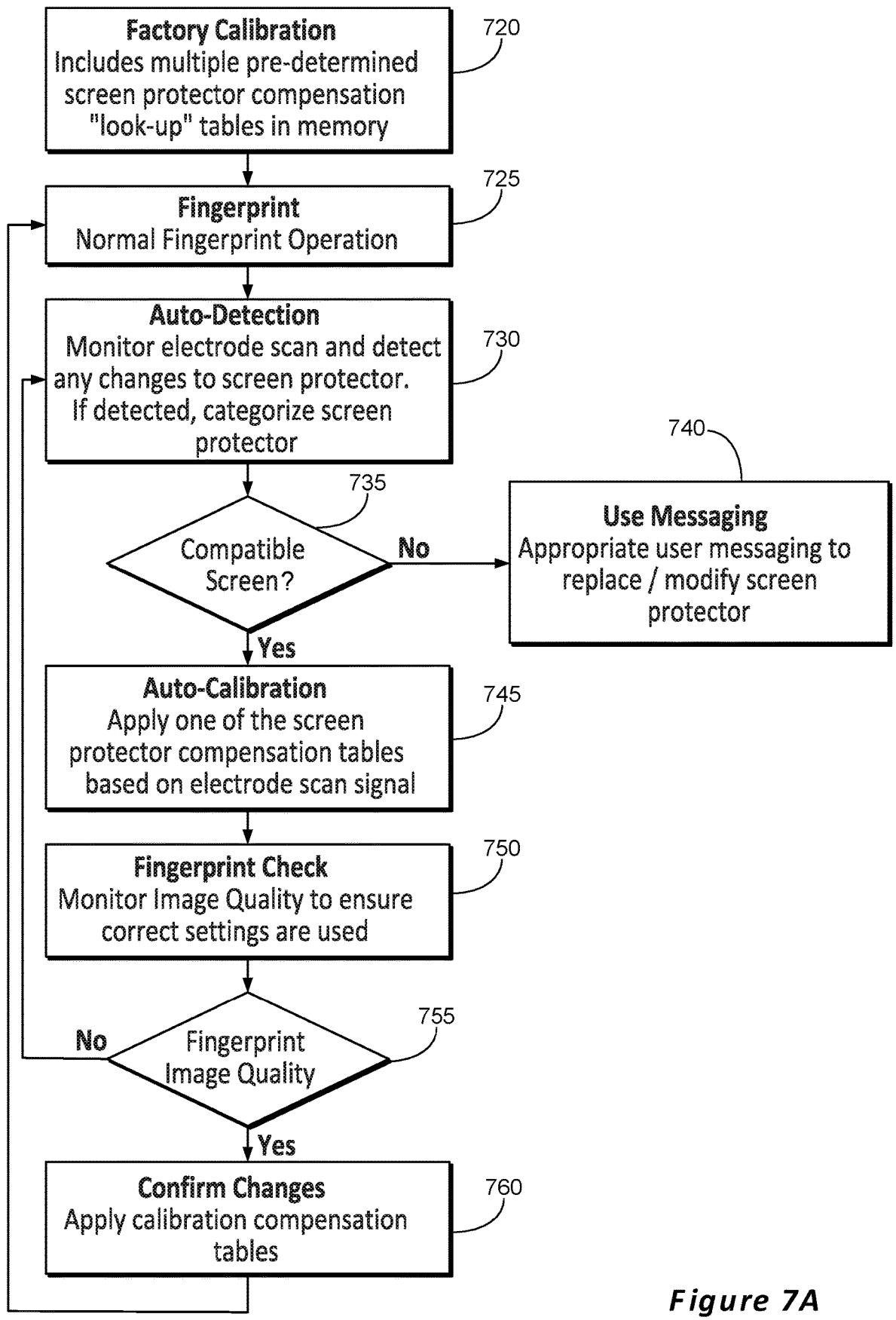
FIG. 7A is a flow diagram that provides examples of operations according to some disclosed methods.

FIG. 7A is a flow diagram that provides examples of operations according to some disclosed methods. The blocks of FIG. 7A may, for example, be performed by the apparatus 101 of FIG. 1, 2, 4A or 4B, or by a similar apparatus. As with other methods disclosed herein, the method outlined in FIG. 7A may include more or fewer blocks than indicated. Moreover, the blocks of methods disclosed herein are not necessarily performed in the order indicated. In some instances, one or more blocks may be performed concurrently.

In this example, block 720 involves a factory calibration process of a device that includes an ultrasonic sensor system. The factory calibration process may involve a number of ultrasonic fingerprint sensor parameters. According to some examples, the factory calibration process may involve "tuning" a particular frequency and RGD, as well as other ultrasonic fingerprint sensor parameters, with reference to a data structure such as a table.

In some implementations, every ultrasonic fingerprint sensor may be shipped from the factory with stored sets of predetermined ultrasonic fingerprint sensor parameter "offsets." The offsets may be, or may include, groups of settings, such as RGD, frequency, some phase information, etc. For example, there may be a factory calibration involving a number of ultrasonic fingerprint sensor parameters, a group of ultrasonic fingerprint sensor parameter settings corresponding to "Offset 1," a group of ultrasonic fingerprint sensor parameter settings corresponding to "Offset 2," a group of ultrasonic fingerprint sensor parameter settings corresponding to "Offset 3," etc. In some examples, each offset may correspond to a different type of screen protector. According to some implementations, the factory calibration data and all of these offsets may be stored in a memory of the device that includes the ultrasonic sensor system (e.g., a memory of a cell phone that includes the ultrasonic sensor system). In some implementations, signal characteristics corresponding to each type of screen protector also may be stored. In some examples, block 720 may involve obtaining, via an electrode proximate a piezoelectric layer of the ultrasonic sensor system, first ultrasonic signals corresponding to reflections from a cover glass/air interface.

According to this example, block 725 involves normal fingerprint sensor operation. For example, block 725 may correspond to a time during which an end user has booted up the device that includes the ultrasonic sensor system and has started using the device. In some examples, block 725 may involve an initial process of obtaining the end user's fingerprint data, of using the fingerprint data to authenticate the end user and provide access to the device, etc. In this example, block 725 involves normal fingerprint sensor operation during a time before the end user has placed a protective cover, a screen protector, etc., on the device. In some examples, block 725 may involve obtaining, via an electrode proximate a piezoelectric layer of the ultrasonic sensor system, first ultrasonic signals corresponding to reflections from a cover glass/air interface.

In this example, block 730 involves periodically obtaining, via the electrode proximate the piezoelectric layer of the ultrasonic sensor system, second ultrasonic signals and comparing the second ultrasonic signals to the first ultrasonic signals. According to some examples, block 730 may involve determining whether a screen protector, a cover, etc., has been placed over a cover glass of the device, and if so what type of screen protector, cover, etc., has been placed over the cover glass. Block 730 may, in some examples, correspond to block 315 of FIG. 3. In some examples, block 730 may involve determining whether a screen protector, cover, etc., that was previously placed over a cover glass of the device has been removed and/or replaced.

According to this implementation, block 735 involves determining whether a screen protector, cover, etc., that was detected and categorized in block 730 is compatible with the ultrasonic sensor system. According to some such implementations, block 735 may involve determining whether the device has a stored "offset," or set of ultrasonic fingerprint sensor parameters, corresponding with the screen protector, cover, etc., that was detected and categorized in block 730. If not, in this example the process continues to block 740, in which one or more prompts are provided to the end user to remove, replace or modify the screen protector, cover, etc. Some examples of user prompts are described below.

However, if it is determined in block 735 that the screen protector, cover, etc., that was detected and categorized in block 730 is compatible with the ultrasonic sensor system, the process continues to block 745. In this example, block 745 involves an auto-calibration process (also referred to herein as a recalibration process), in which a stored set of ultrasonic fingerprint sensor parameters that corresponding with the detected screen protector, cover, etc., is applied to the ultrasonic fingerprint sensor.

According to this example, after block 745 the process continues to block 750, in which one or more sets of fingerprint image data are obtained by the ultrasonic fingerprint sensor and the image quality of the obtained fingerprint image data is evaluated.

Block 755 involves determining whether the fingerprint image quality is acceptable, e.g., whether the fingerprint image quality is at or above a threshold level. If so, the changes to the ultrasonic fingerprint sensor parameters are confirmed in block 760. If not, in this example the process reverts to block 730. In some implementations, if it is determined in block 755 more than a threshold number of times that an auto-calibration process with the same set of ultrasonic fingerprint sensor parameters has failed more than a threshold number of times (e.g., 2 times, 3 times, 4 times, etc.), the process may continue to block 740.

Figure 7B:
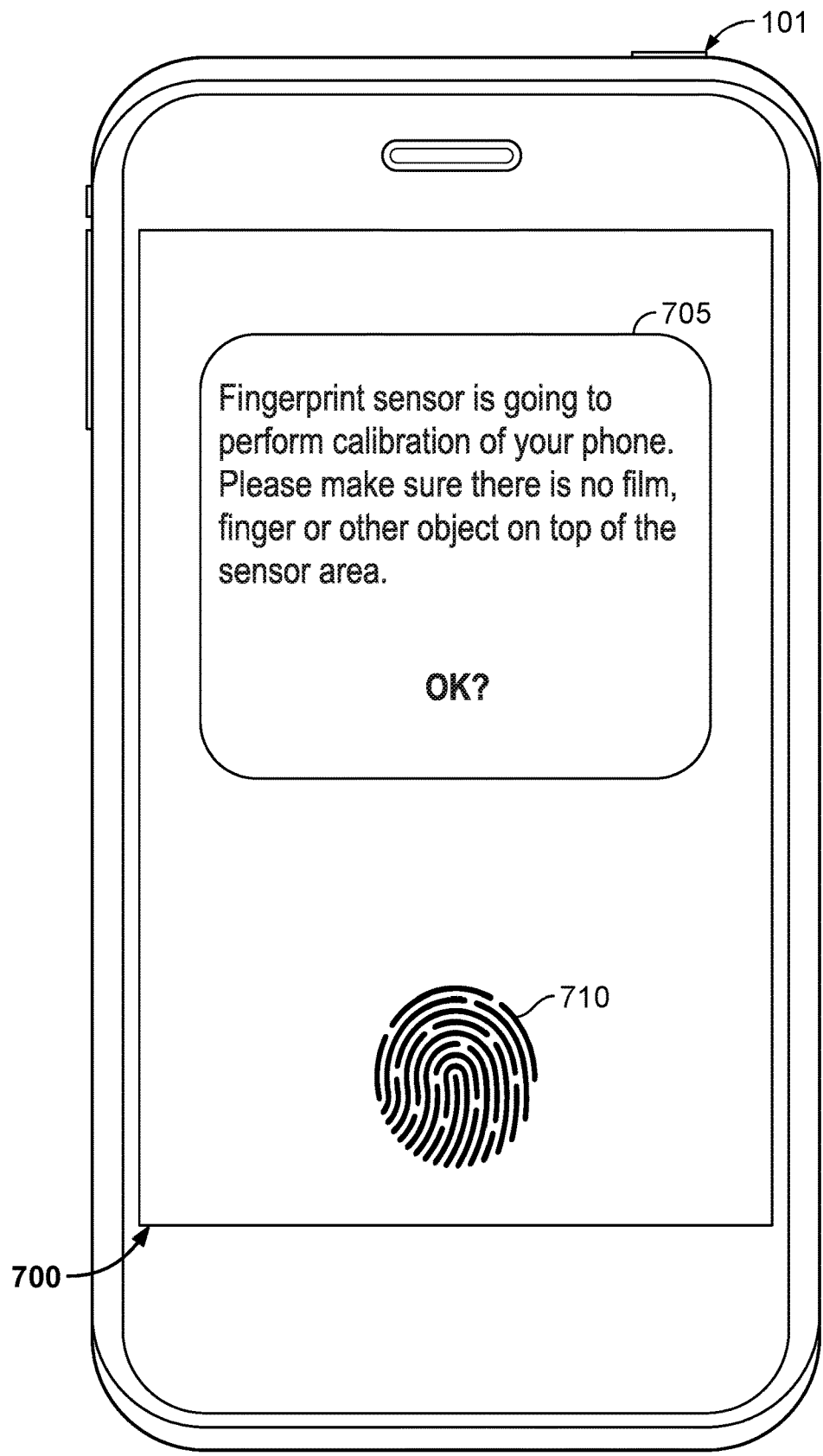
FIG. 7B shows an example of a graphical user interface (GUI) that may be presented in some implementations.

FIG. 7B shows an example of a graphical user interface (GUI) that may be presented in some implementations. In this example, the GUI 700 includes a message area 705 and indicates an ultrasonic sensor system area 710. In this example, the message area 705 is presenting information and a prompt relating to acquiring the above-described "first ultrasonic signals" via the ultrasonic sensor system at a first time. The first time may correspond to an initial calibration process, such as a factory calibration process. In some instances, the first time may correspond to the first time that the ultrasonic sensor system, or a device that includes the ultrasonic sensor system, is booted up. Because the first ultrasonic signals are intended to include reference ultrasonic signals corresponding to reflections from a cover glass/air interface, the message area 705 includes a prompt to ensure that there is no film, finger or other object on the ultrasonic sensor system area 710.

In some implementations, the message area 705 may be a virtual button with which a user may interact, e.g., by touching the message area 705, in order to indicate that there is no film, finger or other object on the ultrasonic sensor system area 710. In some such implementations, the device includes a touch screen, e.g., a touch screen overlying the display that is presenting the GUI 700. A control system may be configured to interpret a touch in the message area 705 as a response to at least a portion of the text in the message area 705, e.g., as an affirmation that there is no film, finger or other object on the ultrasonic sensor system area 710.

Figure 8:
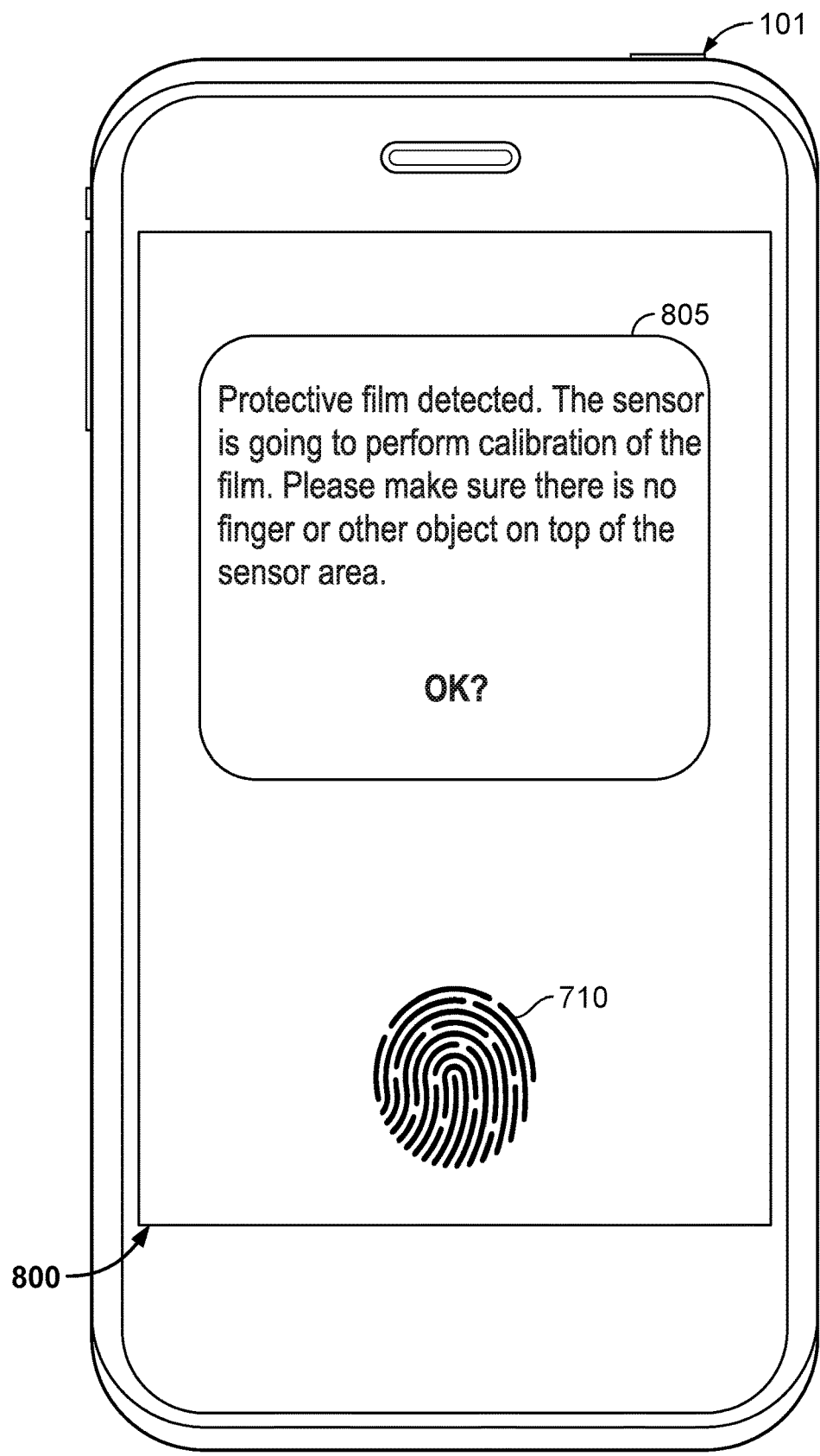
FIG. 8 shows another example of a GUI that may be presented in some implementations.

FIG. 8 shows another example of a GUI that may be presented in some implementations. In this example, the GUI 800 includes a message area 805 and indicates an ultrasonic sensor system area 710. In this example, the message area 805 is presenting information and a prompt relating to acquiring the above-described "second ultrasonic signals" via the ultrasonic sensor system at a second time. The second time may correspond to an end user calibration process. In some instances, the second time may correspond to the first time that the ultrasonic sensor system, or a device that includes the ultrasonic sensor system, is booted up after the user has applied a protective film, put on a protective cover, etc. In this example, the message area 805 is presenting information indicating that the apparatus has determined (e.g., by based on a comparison of the first ultrasonic signals and the second ultrasonic signals) that one or more layers reside on the cover glass and is about to perform a calibration process involving the one or more layers. In some examples, the calibration process may involve performing one or more additional scans in the ultrasonic sensor system area 710 in order to determine one or more signal characteristics corresponding to properties of the one or more layers, such as thickness, material type or material patterning. Accordingly, the message area 805 includes a prompt to ensure that there is no film, finger or other object on the ultrasonic sensor system area 710. In some implementations, the message area 805 is a virtual button with which a user may interact, e.g., by touching the message area 805, in order to indicate that there is no film, finger or other object on the ultrasonic sensor system area 710.

Figure 9:
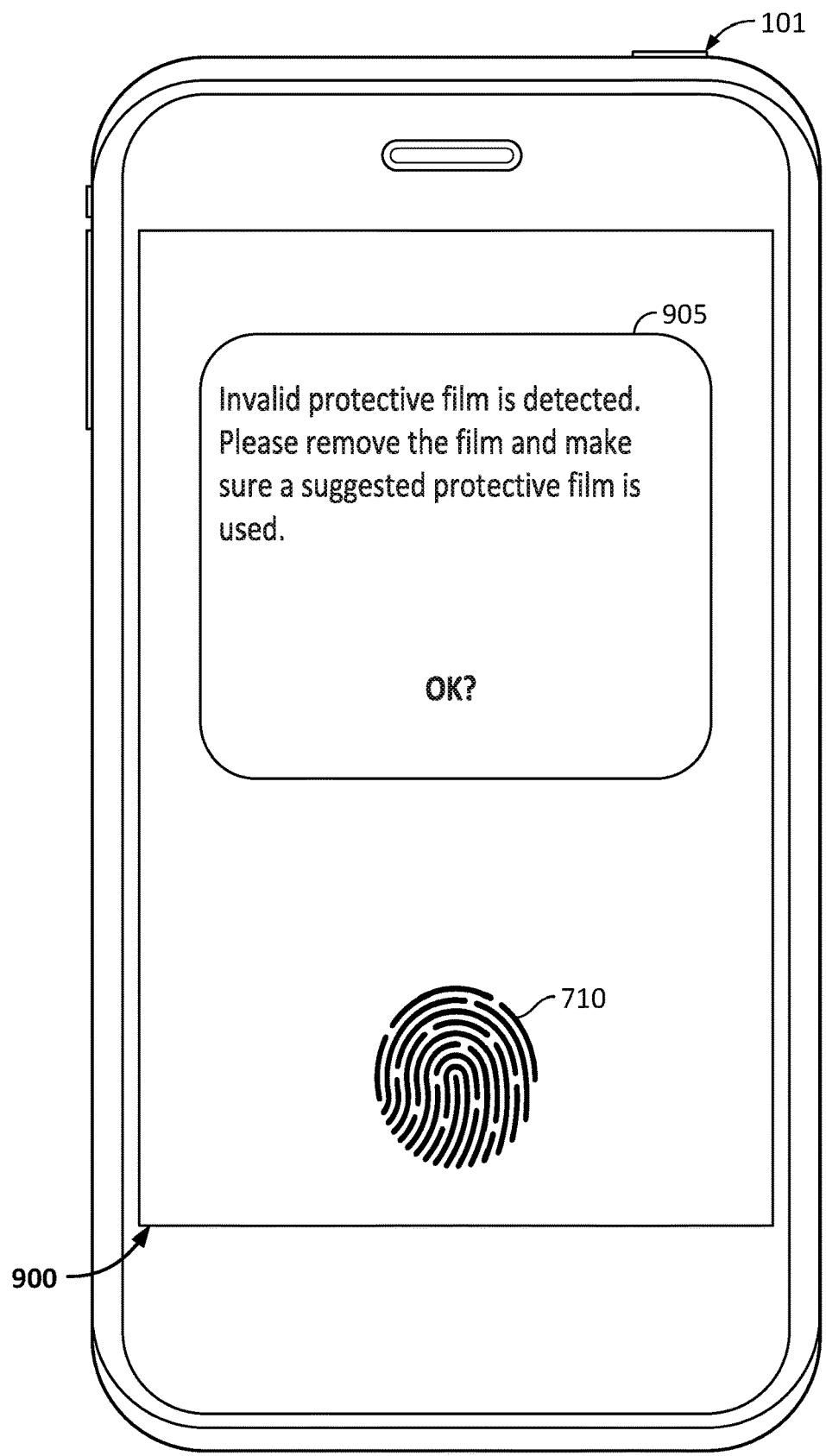
FIG. 9 shows another example of a GUI that may be presented in some implementations.

FIG. 9 shows another example of a GUI that may be presented in some implementations. In this example, a control system of the apparatus 101 has determined that one or more layers are residing on the cover glass and has determined that one or more layers are not compatible with the ultrasonic sensor system. Therefore, the control system is controlling the display to present the GUI 900, including a message area 905 prompting a user to remove the one or more layers. According to some examples, the GUI 900 may be presented in block 740 of FIG. 7A.

Figure 10:
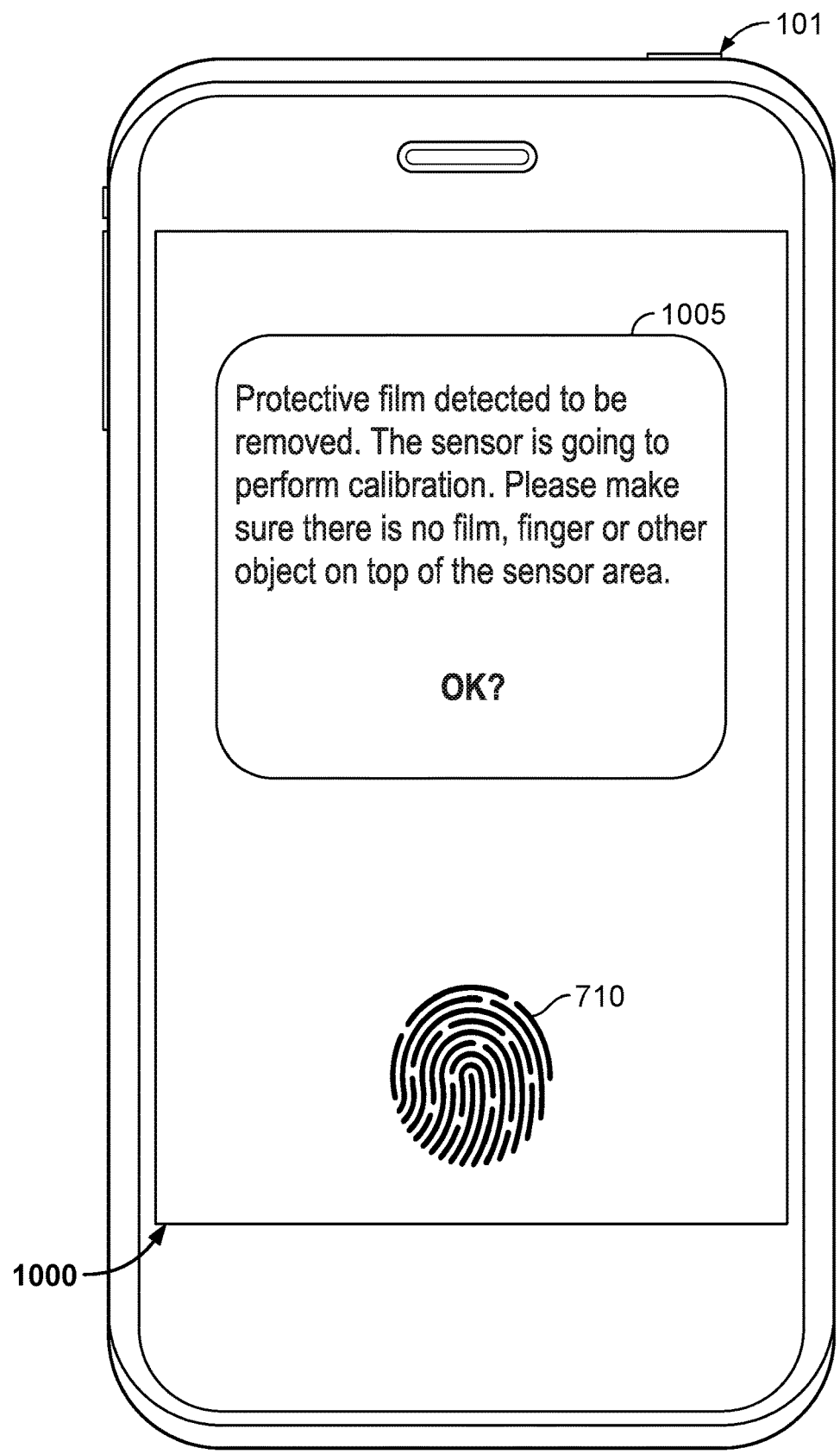
FIG. 10 shows another example of a GUI that may be presented in some implementations.

FIG. 10 shows another example of a GUI that may be presented in some implementations. In some instances, the GUI 1000 may be presented after the GUI 900 is presented. In this example, a control system of the apparatus 101 has determined that one or more layers that were previously residing on the cover glass have been removed. Therefore, the control system is controlling the display to present the GUI 1000, including a message area 1005 prompting a user to ensure that there is no film, finger or other object on the ultrasonic sensor system area 710 so that the apparatus 101 can perform a calibration process. The calibration process may involve performing one or more additional scans in the ultrasonic sensor system area 710. In some implementations, the message area 1005 is a virtual button with which a user may interact, e.g., by touching the message area 1005, in order to indicate that there is no film, finger or other object on the ultrasonic sensor system area 710.

Figure 11:
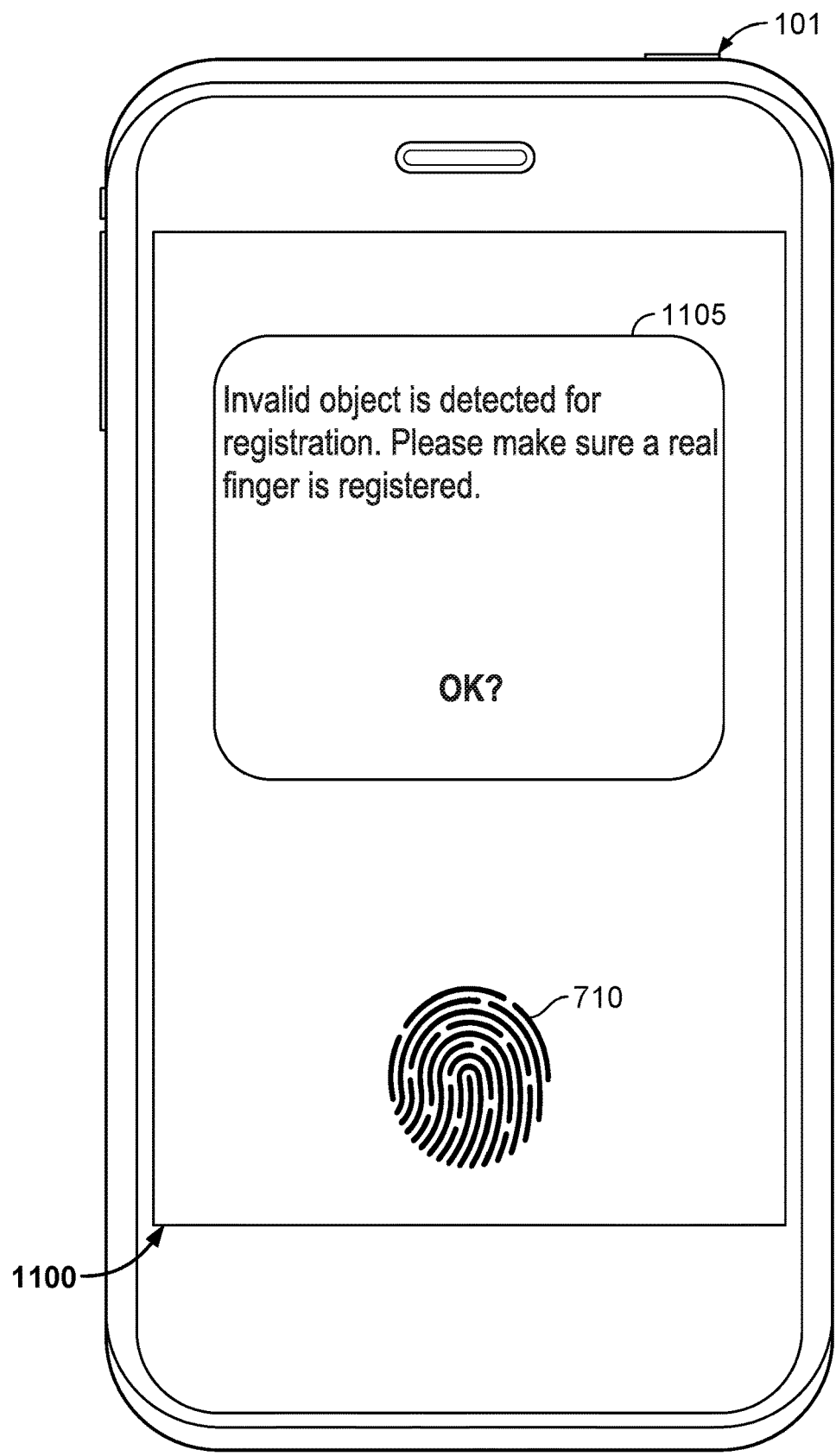
FIG. 11 shows another example of a GUI that may be presented in some implementations.

FIG. 11 shows another example of a GUI that may be presented in some implementations. In this example, the GUI 1100 is being presented in the context of an end-user fingerprint registration process. In some instances, the GUI 1100 may be presented after an end-user calibration process. In this example, a control system of the apparatus 101 has determined that an object in contact with the ultrasonic sensor system area 710 is not a finger. Therefore, the control system is controlling the display to present the GUI 1100, including a message area 1105 prompting a user to ensure that an actual finger is on the ultrasonic sensor system area 710 so that the apparatus 101 can perform a fingerprint registration process.

According to some examples, the apparatus may be configured to perform a liveness detection process or another type of spoof detection process. In some instances, spoofing may involve using a finger-like object that includes silicone rubber, polyvinyl acetate (white glue), gelatin, glycerin, etc., with a fingerprint pattern of a rightful user formed on an outside surface. In some cases, a hacker may form a fingerprint pattern of a rightful user on a sleeve or partial sleeve that can be slipped over or on the hacker's finger. In some implementations, the spoof detection process may be based, at least in part, on a sleeve detection process and/or on ultrasonic signals corresponding to sub-epidermal features. Some such liveness determinations may involve obtaining first sub-epidermal features from first ultrasonic image data at a first time and obtaining second sub-epidermal features from second ultrasonic image data at a second time. Some examples may involve making a liveness determination based on a change between the first sub-epidermal features and the second sub-epidermal features. This type of temporal change may, for example, correspond with the flow of blood within a finger.

Figure 12:
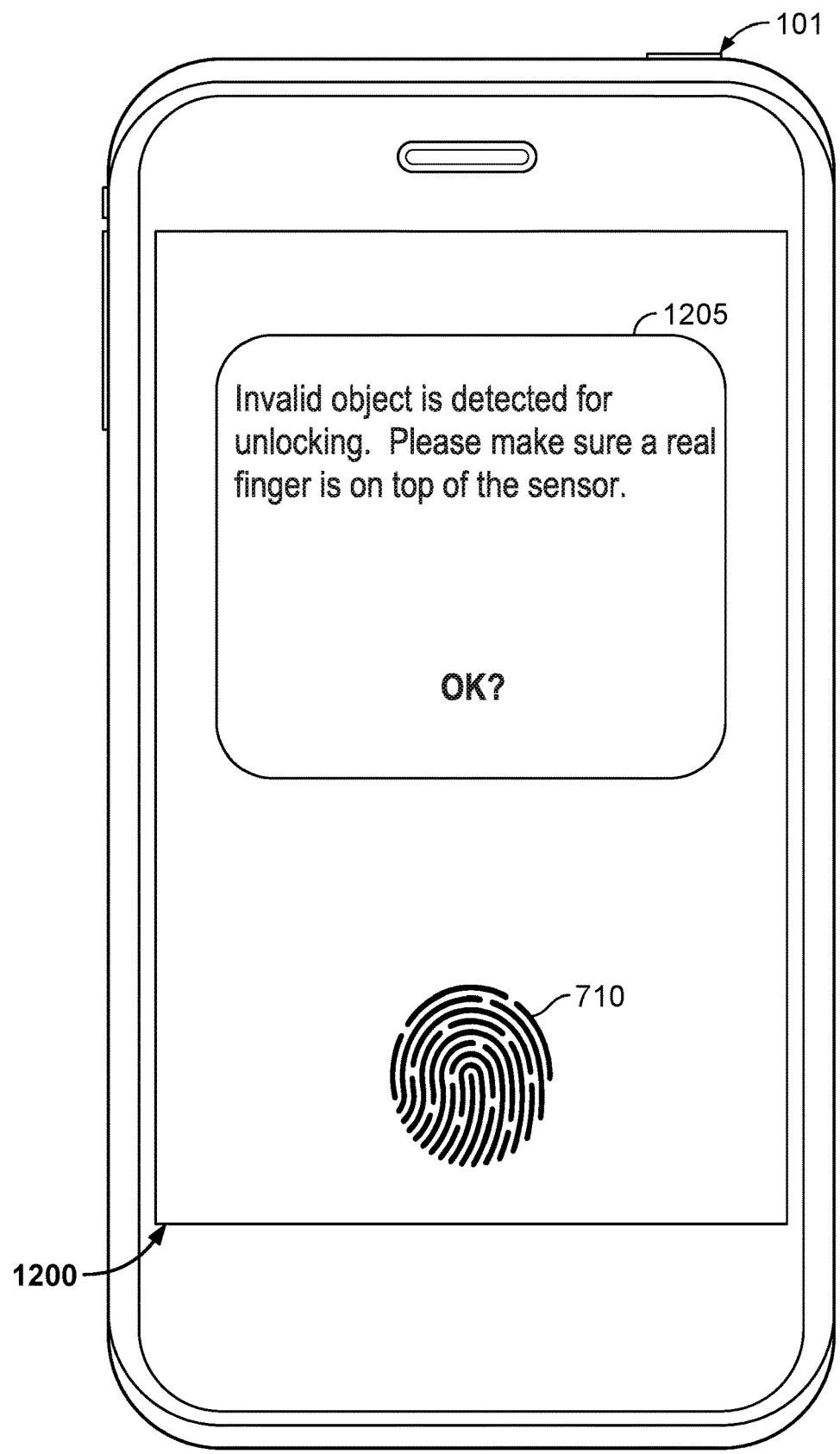
FIG. 12 shows another example of a GUI that may be presented in some implementations.

FIG. 12 shows another example of a GUI that may be presented in some implementations. In this example, the GUI 1200 is being presented in the context of a fingerprint authentication process. In some instances, the GUI 1100 may be presented after an end-user fingerprint registration process. In this example, a control system of the apparatus 101 has determined that an object in contact with the ultrasonic sensor system area 710 is not a finger. Therefore, the control system is controlling the display to present the GUI 1100, including a message area 1205 prompting a user to ensure that an actual finger is on the ultrasonic sensor system area 710 so that the apparatus 101 can perform the fingerprint authentication process.

Figure 13:
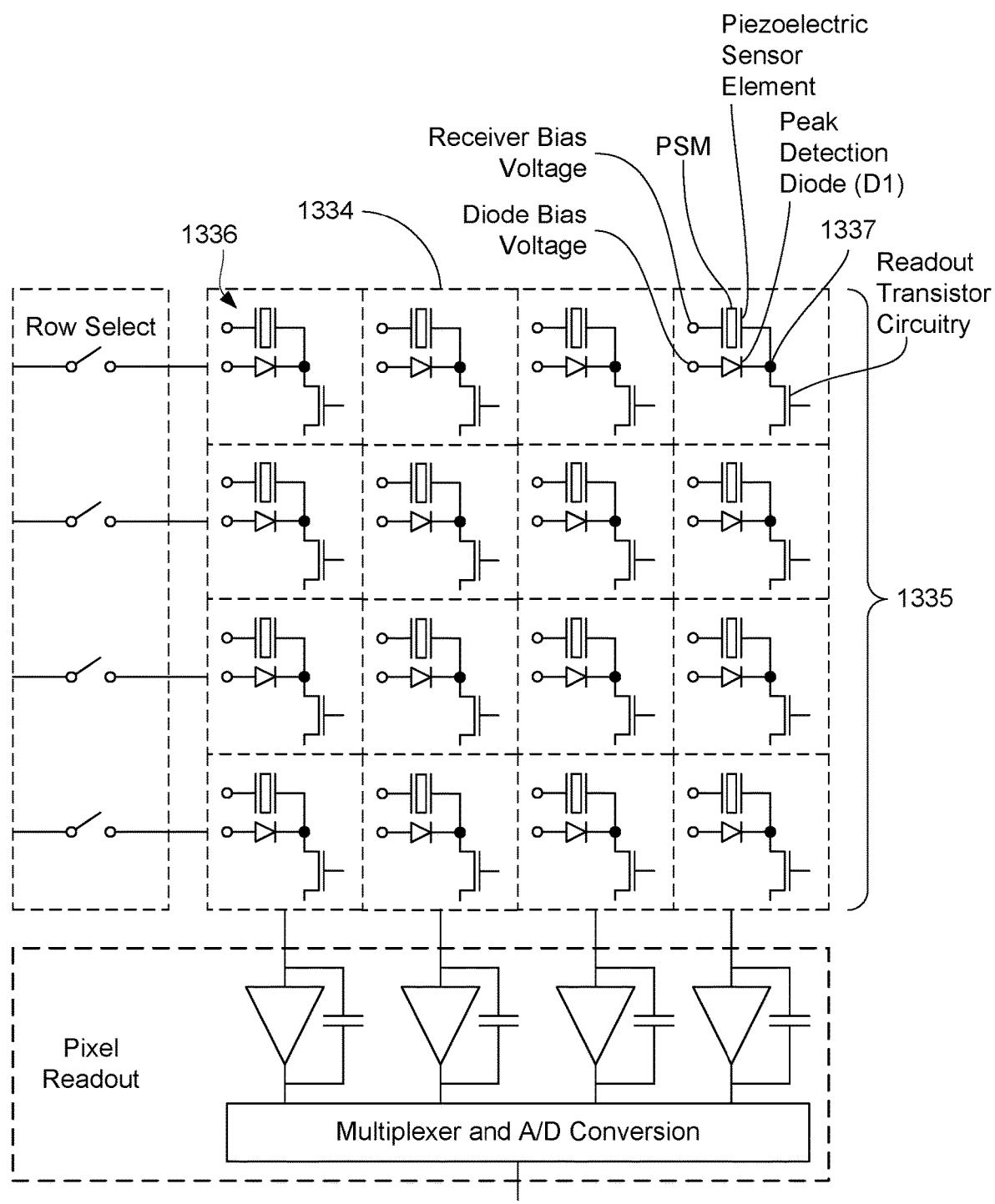
FIG. 13 representationally depicts aspects of a 4×4 pixel array of sensor pixels for an ultrasonic sensor system.

FIG. 13 representationally depicts aspects of a 4×4 pixel array of sensor pixels for an ultrasonic sensor system. Each pixel 1334 may be, for example, associated with a local region of piezoelectric sensor material (PSM), a peak detection diode (D1) and a readout transistor (M3); many or all of these elements may be formed on or in a substrate to form the pixel circuit 1336. In practice, the local region of piezoelectric sensor material of each pixel 1334 may transduce received ultrasonic energy into electrical charges. The peak detection diode D1 may register the maximum amount of charge detected by the local region of piezoelectric sensor material PSM. Each row of the pixel array 1335 may then be scanned, e.g., through a row select mechanism, a gate driver, or a shift register, and the readout transistor M3 for each column may be triggered to allow the magnitude of the peak charge for each pixel 1334 to be read by additional circuitry, e.g., a multiplexer and an A/D converter. The pixel circuit 1336 may include one or more TFTs to allow gating, addressing, and resetting of the pixel 1334.

Each pixel circuit 1336 may provide information about a small portion of the object detected by the ultrasonic sensor system. While, for convenience of illustration, the example shown in FIG. 13 is of a relatively coarse resolution, ultrasonic sensors having a resolution on the order of 500 pixels per inch or higher may be configured with an appropriately scaled structure. The detection area of the ultrasonic sensor system may be selected depending on the intended object of detection. For example, the detection area may range from about 5 mm×5 mm for a single finger to about 3 inches×3 inches for four fingers. Smaller and larger areas, including square, rectangular and non-rectangular geometries, may be used as appropriate for the target object.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also may be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium, such as a non-transitory medium. The processes of a method or algorithm disclosed herein may be implemented in a processor-executable software module which may reside on a computer-readable medium. Computer-readable media include both computer storage media and communication media including any medium that may be enabled to transfer a computer program from one place to another. Storage media may be any available media that may be accessed by a computer. By way of example, and not limitation, non-transitory media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection may be properly termed a computer-readable medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those having ordinary skill in the art, and the generic principles defined herein may be applied to other implementations without departing from the spirit or scope of this disclosure. Thus, the disclosure is not intended to be limited to the implementations shown herein, but is to be accorded the widest scope consistent with the claims, the principles and the novel features disclosed herein. The word "exemplary" is used exclusively herein, if at all, to mean "serving as an example, instance, or illustration." Any implementation described herein as "exemplary" is not necessarily to be construed as preferred or advantageous over other implementations.

Certain features that are described in this specification in the context of separate implementations also may be implemented in combination in a single implementation. Conversely, various features that are described in the context of a single implementation also may be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products. Additionally, other implementations are within the scope of the following claims. In some cases, the actions recited in the claims may be performed in a different order and still achieve desirable results.

It will be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations may be selectively combined to provide one or more comprehensive, but slightly different, technical solutions. It will therefore be further appreciated that the above description has been given by way of example only and that modifications in detail may be made within the scope of this disclosure.

The invention claimed is:

1. An apparatus, comprising:
an ultrasonic sensor system;
a cover glass; and
a control system, at least part of which is coupled to the ultrasonic sensor system, the control system configured to:
acquire first ultrasonic signals via the ultrasonic sensor system at a first time, the first ultrasonic signals including reference ultrasonic signals corresponding to reflections from at least one of a cover glass/air interface or a cover glass/target interface;
acquire second ultrasonic signals via the ultrasonic sensor system at a second time;
determine, based at least in part on a comparison of the first ultrasonic signals and the second ultrasonic signals, whether one or more layers reside on the cover glass at the second time; and, if it is determined that the one or more layers reside on the cover glass at the second time:
determine one or more signal characteristics corresponding to one or more properties of the one or more layers, the one or more properties including one or more of thickness, material type or material patterning; and
determine, based at least in part on the one or more properties, whether the one or more layers are compatible with the ultrasonic sensor system.

2. The apparatus of claim 1, wherein the ultrasonic sensor system includes a piezoelectric layer, an electrode proximate a first side of the piezoelectric layer and an array of ultrasonic sensor pixels proximate a second side of the piezoelectric layer, wherein the first ultrasonic signals and the second ultrasonic signals are received via the electrode.

3. The apparatus of claim 1, wherein acquisition of the first ultrasonic signals via the ultrasonic sensor system at the first time corresponds to at least a portion of a factory calibration process.

4. The apparatus of claim 1, wherein the second time corresponds to at least a portion of an end user calibration process.

5. The apparatus of claim 1, wherein the control system is further configured to determine that the one or more layers are compatible with the ultrasonic sensor system and wherein the control system is further configured to calibrate the ultrasonic sensor system based, at least in part, on the one or more properties of the one or more layers.

6. The apparatus of claim 1, further comprising a display stack residing between the ultrasonic sensor system and the cover glass, wherein the control system is configured for controlling the display stack to present one or more graphical user interfaces corresponding to at least one of a factory calibration process or a fingerprint registration process.

7. The apparatus of claim 6, wherein the control system is configured for controlling the display stack to present a graphical user interface prompting a user to ensure that there is no layer residing on the cover glass prior to acquiring the first ultrasonic signals.

8. The apparatus of claim 6, wherein the control system is further configured to determine that one or more layers are residing on the cover glass and determine that the one or more layers are compatible with the ultrasonic sensor system, and wherein the control system is configured for controlling the display stack to present a graphical user interface which indicates an ultrasonic sensor system area and prompts a user to ensure that there is no finger or other object in the ultrasonic sensor system area prior to acquiring the second ultrasonic signals.

9. The apparatus of claim 6, wherein the control system is further configured to determine that one or more layers are residing on the cover glass and determine that the one or more layers are not compatible with the ultrasonic sensor system, and wherein the control system is further configured for controlling the display stack to present a graphical user interface prompting a user to remove the one or more layers.

10. The apparatus of claim 6, wherein the control system is further configured for controlling the display stack to present a graphical user interface which indicates an ultrasonic sensor system area and prompts a user to touch the ultrasonic sensor system area.

11. The apparatus of claim 10, wherein the control system is further configured for controlling the ultrasonic sensor system to acquire third ultrasonic signals at a third time, the third ultrasonic signals including registration ultrasonic signals corresponding to reflections from a digit in contact with the ultrasonic sensor system area.

12. A method of controlling an ultrasonic sensor system, the method comprising:
  acquiring first ultrasonic signals via the ultrasonic sensor system at a first time, the first ultrasonic signals including reference ultrasonic signals corresponding to reflections from at least one of a cover glass/air interface or a cover glass/target interface;
  acquiring second ultrasonic signals via the ultrasonic sensor system at a second time;
  determining, based at least in part on a comparison of the first ultrasonic signals and the second ultrasonic signals, whether one or more layers reside on a cover glass at the second time; and, if it is determined that the one or more layers reside on the cover glass at the second time:
  determining one or more signal characteristics corresponding to one or more properties of the one or more layers, the one or more properties including one or more of thickness, material type or material patterning; and
  determining, based at least in part on the one or more properties, whether the one or more layers are compatible with the ultrasonic sensor system.

13. The method of claim 12, wherein the ultrasonic sensor system includes a piezoelectric layer, an electrode proximate a first side of the piezoelectric layer and an array of ultrasonic sensor pixels proximate a second side of the piezoelectric layer, wherein the first ultrasonic signals and the second ultrasonic signals are received via the electrode.

14. The method of claim 12, wherein the first time corresponds to at least a portion of a factory calibration process.

15. The method of claim 12, wherein the second time corresponds to at least a portion of an end user calibration process.

16. The method of claim 12, wherein it is determined that the one or more layers are compatible with the ultrasonic sensor system, further comprising calibrating the ultrasonic sensor system based, at least in part, on the one or more properties of the one or more layers.

17. The method of claim 12, further comprising controlling a display to present one or more graphical user interfaces corresponding to at least one of a factory calibration process or a fingerprint registration process.

18. The method of claim 12, further comprising controlling a display to present a graphical user interface prompting a user to ensure that there is no layer residing on the cover glass prior to acquiring the first ultrasonic signals.

19. The method of claim 12, wherein it is determined that one or more layers are residing on the cover glass and it is determined that the one or more layers are compatible with the ultrasonic sensor system, further comprising controlling a display to present a graphical user interface indicating an ultrasonic sensor system area and prompting a user to ensure that there is no finger or other object in the ultrasonic sensor system area prior to acquiring the second ultrasonic signals.

20. The method of claim 12, wherein it is determined that one or more layers are residing on the cover glass and it is determined that the one or more layers are not compatible with the ultrasonic sensor system, further comprising controlling a display to present a graphical user interface prompting a user to remove the one or more layers.

21. The method of claim 12, further comprising controlling a display to present a graphical user interface indicating an ultrasonic sensor system area and prompting a user to touch the ultrasonic sensor system area during a fingerprint registration process.

22. The method of claim 21, further comprising controlling the ultrasonic sensor system to acquire third ultrasonic signals at a third time, the third ultrasonic signals including registration ultrasonic signals corresponding to reflections from a digit in contact with the ultrasonic sensor system area.

23. One or more non-transitory media having software stored thereon, the software including instructions for controlling one or more device to perform a method of controlling an ultrasonic sensor system, the method comprising:
  acquiring first ultrasonic signals via the ultrasonic sensor system at a first time, the first ultrasonic signals including reference ultrasonic signals corresponding to reflections from at least one of a cover glass/air interface or a cover glass/target interface;
  acquiring second ultrasonic signals via the ultrasonic sensor system at a second time;
  determining, based at least in part on a comparison of the first ultrasonic signals and the second ultrasonic signals, whether one or more layers reside on the cover glass at the second time; and, if it is determined that the one or more layers reside on the cover glass at the second time:
  determining one or more signal characteristics corresponding to one or more properties of the one or more layers, the one or more properties including one or more of thickness, material type or material patterning; and
  determining, based at least in part on the one or more properties, whether the one or more layers are compatible with the ultrasonic sensor system.

24. The one or more non-transitory media of claim 23, wherein the ultrasonic sensor system includes a piezoelectric layer, an electrode proximate a first side of the piezoelectric layer and an array of ultrasonic sensor pixels proximate a second side of the piezoelectric layer, wherein the first ultrasonic signals and the second ultrasonic signals are received via the electrode.

25. The one or more non-transitory media of claim 23, wherein the first time corresponds to at least a portion of a factory calibration process and wherein the second time corresponds to at least a portion of an end user calibration process.

26. The one or more non-transitory media of claim 23, wherein it is determined that the one or more layers are compatible with the ultrasonic sensor system, further comprising calibrating the ultrasonic sensor system based, at least in part, on the one or more properties of the one or more layers.

27. An apparatus, comprising:
ultrasonic sensor means;
a cover glass; and
control means for:
    acquiring first ultrasonic signals via the ultrasonic sensor system at a first time, the first ultrasonic signals including reference ultrasonic signals corresponding to reflections from at least one of a cover glass/air interface or a cover glass/target interface;
    acquiring second ultrasonic signals via the ultrasonic sensor system at a second time;
    determining, based at least in part on a comparison of the first ultrasonic signals and the second ultrasonic signals, whether one or more layers reside on the cover glass at the second time; and, if it is determined that the one or more layers reside on the cover glass at the second time:
        determining one or more signal characteristics corresponding to one or more properties of the one or more layers, the one or more properties including one or more of thickness, material type or material patterning; and
        determining, based at least in part on the one or more properties, whether the one or more layers are compatible with the ultrasonic sensor system.

28. The apparatus of claim 27, wherein the ultrasonic sensor system includes a piezoelectric layer, an electrode proximate a first side of the piezoelectric layer and an array of ultrasonic sensor pixels proximate a second side of the piezoelectric layer, wherein the first ultrasonic signals and the second ultrasonic signals are received via the electrode.

* * * * *